United States Patent [19]

Matsumoto et al.

[11] Patent Number: 5,134,309
[45] Date of Patent: Jul. 28, 1992

[54] PREAMPLIFIER, AND WAVEFORM SHAPING CIRCUIT INCORPORATING SAME

[75] Inventors: Motoaki Matsumoto; Hideaki Kimura, both of Kanagawa, Japan

[73] Assignee: Fuji Photo Film Co., Ltd., Kanagawa, Japan

[21] Appl. No.: 534,614

[22] Filed: Jun. 7, 1990

[30] Foreign Application Priority Data

Jun. 8, 1989 [JP] Japan .................................. 1-143972
Jul. 19, 1989 [JP] Japan .................................. 1-187122
Dec. 1, 1989 [JP] Japan .................................. 1-310759
Mar. 26, 1990 [JP] Japan .................................. 2-73199

[51] Int. Cl.$^5$ .................. H03K 5/08; H03K 17/00; H03F 3/04
[52] U.S. Cl. ............................ 307/264; 307/268; 307/358; 307/475; 307/494; 330/302
[58] Field of Search ............ 307/260, 261, 264, 358, 307/530, 493, 494, 475, 268; 330/252, 302, 306

[56] References Cited

FOREIGN PATENT DOCUMENTS 0043209 2/1987 Japan .................................. 307/358

Primary Examiner—John Zazworsky
Attorney, Agent, or Firm—Sughrue, Mion, Zinn, Macpeak & Seas

[57] ABSTRACT

A preamplifier providing adequate boost even to weak and small input currents, and thus achieving favorable gain and signal-to-noise ratio. An input current is converted to a voltage, which is provided to a differential amplification section. A phase-adjusted version of that voltage signal also is provided to the differential amplifier, the differential amplifier thus outputting an amplified signal based on the phase difference between its inputs. The preamplifier may be incorporated on a single chip, using MOS transistors or gallium arsenide techniques. A level clamping device may be provided in the event that the input current exceeds a predetermined value. The inventive preamplifier also may be incorporated advantageously into a waveform shaping circuit.

28 Claims, 24 Drawing Sheets

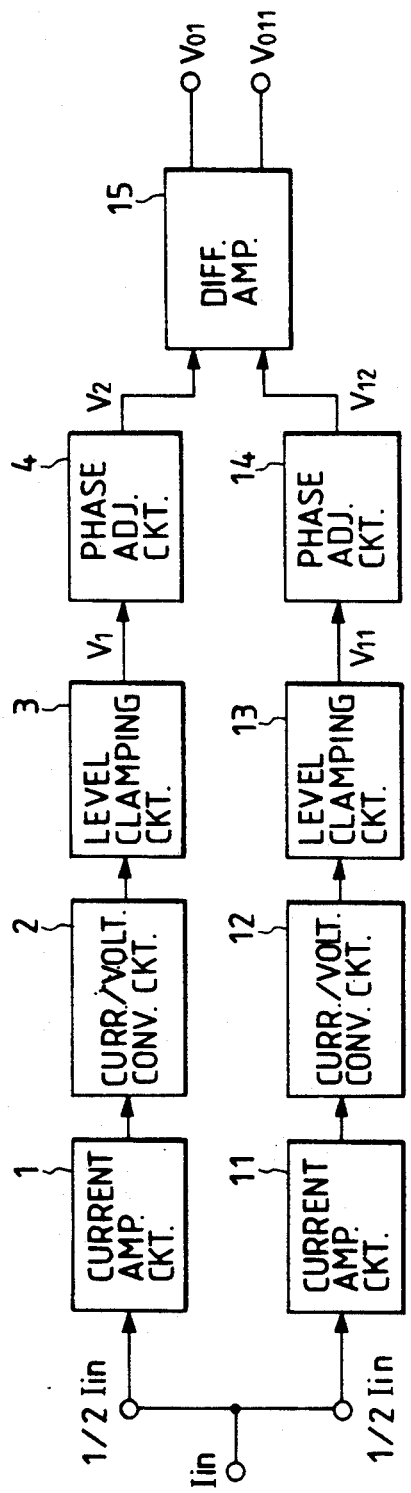
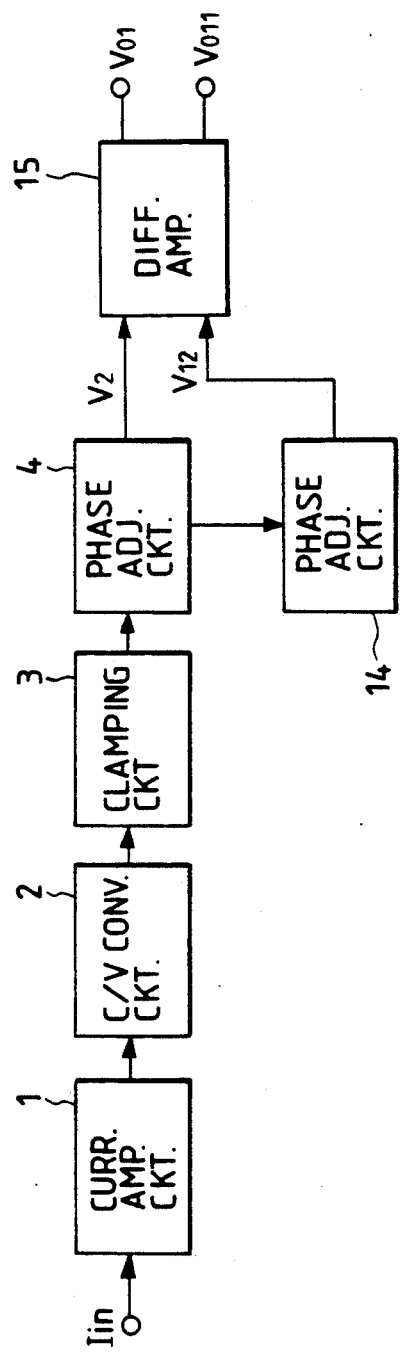

TIME ($\mu$s)

PREAMPLIFIER, AND WAVEFORM SHAPING CIRCUIT INCORPORATING SAME

BACKGROUND OF THE INVENTION

The present invention relates to a preamplifier for amplifying, to the desired level, electric signals generated by transducers such as photoelectric conversion elements and magnetoelectric conversion elements. In another aspect, the invention also relates to a waveform shaping circuit incorporating the inventive preamplifier.

In many cases, electric signals, such as those in electric current and voltage generated by the above-mentioned transducers, are weak. If such signals are transmitted as they are, their signal-to-noise (S/N) ratio will be unsatisfactory. Therefore, it is known to amplify such signals to a desired level by means of a preamplifier, and then to feed them to a signal processing circuit such as a main amplifier, a control circuit, or the like, via a signal transmission line. Accordingly, it is required for a preamplifier to have such characteristics as an excellent signal-to-noise ratio and a high gain.

With a view to satisfying the foregoing conditions, various preamplifiers have been proposed. For example, a preamplifier including an automatic gain control circuit, an output circuit, and a negative feedback circuit has been described in IEEE JOURNAL OF SOLID-STATE CIRCUITS, Vol. SC-21, Apr. 1986, pp 324–330. That preamplifier is capable of controlling gain to a desired level, and in addition has improved frequency characteristics using negative feedback.

However, the preamplifier mentioned above has the following problems. The preamplifier has a complicated overall circuit construction because it needs a control signal generating device for performing gain control, an adjusting device for adjusting the control signals, and so forth. Moreover, since the preamplifier does not have any way of setting an operating frequency in a desired frequency range, nor any way of setting a desired gain and phase, it is difficult to eliminate noise components in a given frequency range, or to eliminate small-amplitude noise components.

Furthermore, the above-mentioned preamplifier is not capable of amplifying the input signals fed into it at a given frequency or in a given amplitude by a desired gain or in an arbitrarily selected phase. In addition, such a preamplifier suffers from decreased gain because its negative feedback circuit is composed of negative feedback resistors.

In another aspect, the present invention relates to a waveform shaping circuit which converts small input current into digital signals at the TTL level, and more particularly to a waveform shaping circuit incorporated in a one-chip integrated circuit on one semiconductor board.

Various proposals have been made for converting input current into digital voltage signals. One example is disclosed in the article, "A Method of Constructing an Integrated High Speed Optical Reception Circuit," *Proceedings of General National Assembly of Electronic Communication Society*—1984, No. 2638. pp. 10–334.

Specifically, the method presented therein consists in: 1) obtaining the output signal via a branch circuit after the input current fed from a photoelectric converting element is amplified by a plurality of amplifiers, including a preamplifier; and 2) providing a switching circuit for performing the switching of the input dynamic range, an AGC feedback circuit a DC feedback circuit, etc. for controlling the gain in the amplifying system.

The above-mentioned method results in complicated circuit construction, because the method requires various types of feedback circuits, switching circuits, and so forth in addition to the circuits for the amplifying system. Moreover, with such circuit construction, it is not easy to control fluctuations in temperature and current, nor is it easy to compensate for noise. Furthermore, the method makes it inconvenient to install the system, because the analog signal processing system and the digital signal processing system therein are incorporated into separate integrated circuits.

The present inventors have paid particularly keen attention to the accomplishment of the following technical tasks in the course of their development of a waveform shaping circuit which generates digital output signals from input current: 1) providing simple circuit construction for easy incorporation in an integrated circuit, desirably in a one-chip integrated circuit, in order to minimize unfavorable influence due to external factors and, above all, to enable convenient installation of the circuit; 2) achieving stable operation of the circuit with almost no influence from fluctuations in temperature and the current; 3) providing a circuit capable of converting small input current, on the order of approximately several $\mu A$ into arbitrarily desired digital signals—for example, into signals approximately at the TTL level; 4) providing a circuit capable of generating digital voltage signals in a certain amplitude range even if there are fluctuations in input current and amplifier gain; and 5) providing a circuit capable of performing stable operation against noise.

SUMMARY OF THE INVENTION

The present invention has been made in view of the problems mentioned above, and therefore one object is to provide a preamplifier which has simple circuit construction, which also permits the setting of its operating frequency in an arbitrarily selected frequency range, and which is capable of performing its amplifying operations at a desired gain and in a desired phase.

The above-mentioned and other objects of the invention are accomplished by dividing the input signal into two signals having the same phase and converting the divided signal into two voltage signals having the same phase, feeding the divided voltage signals individually to two phase adjusting circuits set up with a desired phase difference, and thereafter feeding the phase-adjusted voltage signals obtained from the two phase adjusting circuits to a pair of input terminals of a differential amplifier. The differential amplifier amplifies the signals on the basis of the phase (voltage) difference of the voltage signals.

With a preamplifier constructed in this manner, it is possible to set the frequency range, gain, and phase between the output signals arbitrarily for the entire preamplifier. Consequently, it is possible to eliminate the noise components present in a given frequency range, and also to amplify the signals in a given frequency range at a desired gain. Thus it is possible to produce a preamplifier with a favorable signal-to-noise ratio.

Another object of the invention is to provide a preamplifier which has a simple circuit construction and additionally offers ease in gain control.

The above-mentioned and other objects of the invention are accomplished by converting an input signal into a voltage signal and feeding the converted input signal to one of a pair of input terminals of a differential amplifier, and also by phase adjusting the voltage signal, feeding the phase-adjusted voltage signal to the other one of the pair of input terminals of the differential amplifier, and obtaining an output signal corresponding to the difference in voltage between the signals at the input terminals.

The just-mentioned object also can be accomplished by reducing a change in the level of the voltage signal, in addition to converting the input signal into the voltage signal, when the input signal exceeds a predetermined value.

With a preamplifier constructed as just described, the voltage levels at the pair of input terminals will change based on the phase adjustment, the adjustment being derived from the relation between the voltage signals fed to the input terminals of the differential amplifier. Accordingly, an output signal based on the difference in level between the voltage signals will be obtained from the differential amplifier, so that it will be possible to amplify a weak input signal with a high gain. Moreover, when the input signal rises above a predetermined value, the inventive preamplifier reduces a change in level of such a voltage signal in its signal conversion circuit, so that the preamplifier does not need any external gain control circuit.

The above-mentioned object of the present invention also is accomplished by a preamplifier which includes a first signal processing system, which converts an input signal, for example a weak or small input current or the like, into a voltage, and amplifies the voltage to a desired level; a second signal processing system, including at least a filtering circuit and a phase adjusting circuit, which generates an output signal having a desired phase difference in relation to the output signal from the first signal processing system; a plurality of amplifiers, having different gains, for performing comparison and amplification in correspondence to the phase difference, or the difference in voltage, between the output signal from the first signal processing system and the output signal from the second signal processing system; and either a transmission selecting device, including a switching circuit, for selectively transmitting one of the output signal from the first signal processing system and the output signal from the second signal processing system to the plurality of amplifiers; or a selecting device, which selects the driving of the individual amplifiers in case each of the output signals is transmitted to the plurality of amplifiers without being channeled through the transmission device.

With a preamplifier constructed as just described, it is possible to set the output signal from the second signal processing system so as to have a difference in level, corresponding to the phase difference, given to the output signal in the phase adjusting circuit in relation to the output signal from the first signal processing system. Also, it is possible arbitrarily to set the overall frequency characteristics and gain of the preamplifier, as well as the phases of the output signals from it, through comparative amplification performed in response to the voltage difference based on the phase difference, with the output signal from the first signal processing system and the output signal from the second signal processing system being fed to the amplifier selected by the transmission selecting device or the selecting device. Consequently, this preamplifier makes it possible to eliminate noise within a given frequency range and also to amplify the signals in a given frequency range at a desired gain. Thus, the present invention can offer a preamplifier which attains a favorable signal-to-noise ratio.

Still another object of the invention is to provide a waveform shaping circuit, having simple construction and also being capable of operating very stably in the presence of external disturbances, such as power fluctuations and noise.

The just-mentioned and other objects of the invention are attained by providing an analog signal processing system, having one input and two outputs, which obtains a voltage output based on the input current; a digital signal processing system, which obtains digital signals based on the voltage output; and a level conversion circuit having one input and one output, these three elements being arranged in series. The invention also consists in providing a preamplifying circuit incorporating a phase adjusting circuit in the input section to the analog signal processing system, and an analog-digital conversion circuit with an output section having level clamping function to clamp the amplitude of the digital signals to the digital signal processing system.

Furthermore, the inventive waveform shaping circuit is formed by constructing all of its elements, from the amplifying circuit, which takes as its input the voltage in the preamplifying circuit forming the above-mentioned analog signal processing system, to the amplifying circuit, which works as the output channel for the analog-digital conversion circuit, with two inputs and two outputs, and performing differential amplification.

Moreover, this and other objects of the invention are attained by integrating all of the individual circuits forming the analog signal processing system and the digital signal processing system into a single semiconductor chip, while separating the respective power source lines and the grounding lines for the analog and digital signal processing systems.

The waveform shaping circuit constructed as just described is capable of generating two outputs for one input by the effect of a phase adjusting circuit provided in its preamplifying circuit, and the amplification of these two outputs by a differential amplifying circuit, which is significantly less susceptible to the influence of external disturbances. As a result, the inventive waveform shaping circuit can perform its waveform shaping with a high degree of stability against fluctuations in temperature and electric current. Furthermore, owing to the level clamping function provided for clamping the level of the digital signals in the digital signal processing system, the waveform shaping circuit can prevent fluctuations in amplitude of digital signals. Also, since all the individual circuits forming the waveform shaping circuit are incorporated into a single chip, with the power source lines being properly separated, the circuit is not susceptible to the influence of noise, etc., and offers greater ease in actual installation.

BRIEF DESCRIPTION OF THE DRAWINGS

The manner in which the above objects, features and advantages of the invention are attained will be fully evident when the invention is considered in light of the accompanying drawings, wherein:

FIG. 1 is a circuit block diagram showing the basic construction of a preamplifier according to a first embodiment of the invention;

FIG. 7 is a circuit block diagram illustrating a second embodiment of the invention;

DETAILED DESCRIPTION OF THE PREFERRED EMBODIMENTS

Figure 2:
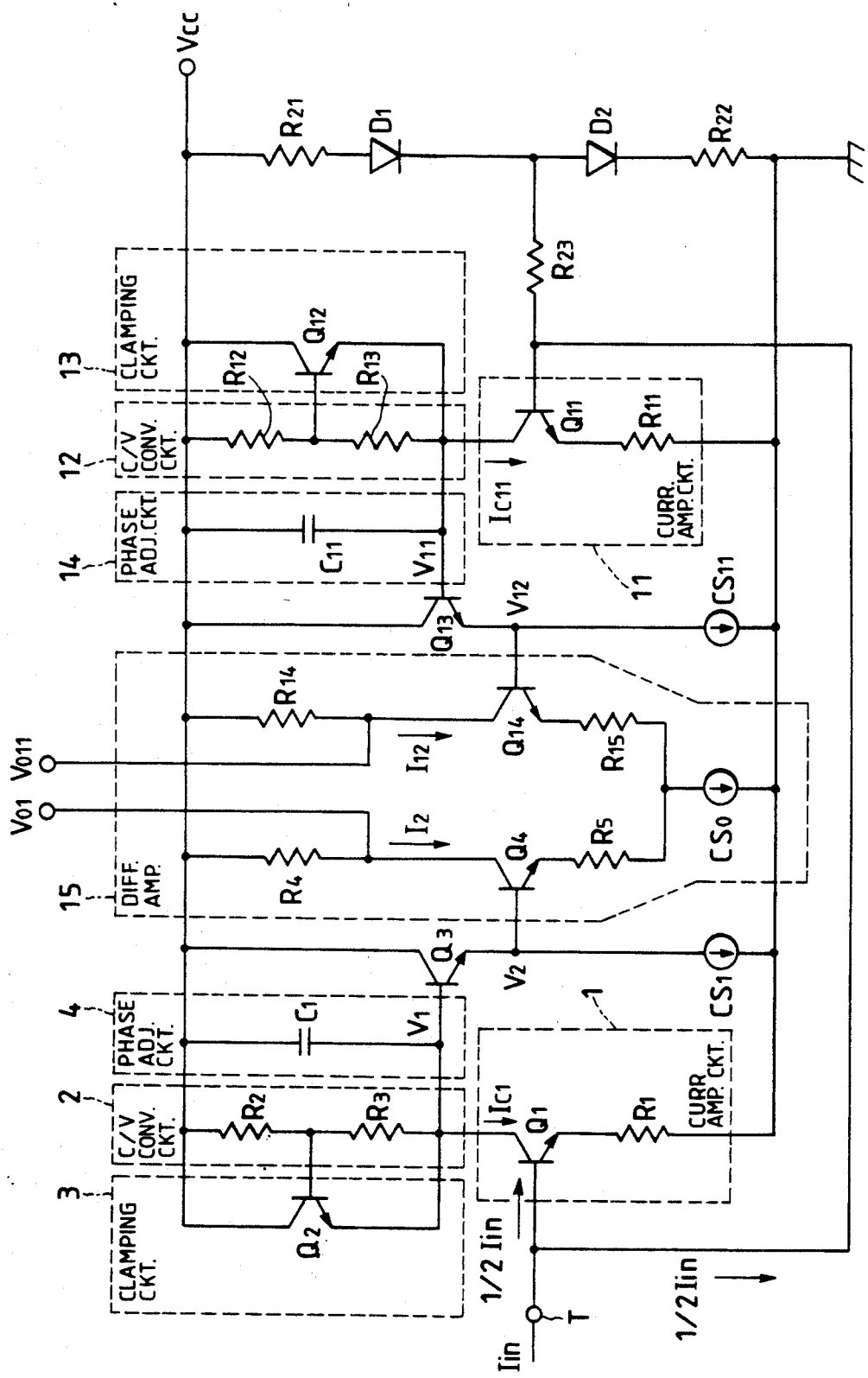
FIG. 2 is a circuit diagram showing a specific example of the preamplifier of FIG. 1.

First, overall circuit construction of a first embodiment of the invention will be described with reference to FIG. 1 and FIG. 2. Current amplifying circuits 1 and 11 divide the input current $I_{in}$ into two equal parts, and also amplify those parts. In this regard, the division of the input current is accomplished by setting the input impedance of the current amplifying circuits 1 and 11 at the same value.

Current-voltage conversion circuits 2 and 12 perform conversion with a voltage drop in resistors $R_2$ and $R_3$ in the current-voltage conversion circuit 2, and with a voltage drop in the resistors $R_{12}$ and $R_{13}$ in the current-voltage conversion circuit 12. Clamping circuits 3 and 13 clamp the voltage drop in the resistors $R_3$ and $R_{13}$ when the input current $I_{in}$ becomes large.

Phase adjusting circuits 4 and 14 include capacitors $C_1$ and $C_{11}$ which have different capacitances, and in particular $C_1 < C_{11}$. Then, a differential amplifier 15 produces the output signals $V_{01}$ and $V_{011}$ having opposite phases by performing comparison and amplification on the basis of the phase difference, which is equivalent to a corresponding voltage difference of the voltage signals $V_2$ and $V_{12}$ as phase-adjusted by the phase adjusting circuits 4 and 14.

Next referring to FIGS. 2 through 5, the operation of the circuits will be described. First, when there is no input, the state of balance is as follows. The respective current amplification factors of the NPN transistors $Q_1$ and $Q_{11}$ and the respective resistance values of the resistors $R_1$ through $R_3$ and the resistors $R_{11}$ through $R_{13}$, which together form the current amplifying circuits 1 and 11, are set to substantially the same values. Therefore, when a bias voltage is applied from a bias voltage setting circuit (which is composed of the resistors $R_{21}$ through $R_{23}$ and the diodes $D_1$ and $D_2$) shown on the right side of FIG. 2, approximately the same collector currents are fed to the transistors $Q_1$ and $Q_{11}$. As a result, the voltage drop $V_1$ by the resistors $R_2$ and $R_3$ and the voltage drop $V_{11}$ by the resistors $R_{12}$ and $R_{13}$ will be almost equal so that the respective bases of the individual transistors $Q_3$ and $Q_{13}$, which operate together as a buffer amplifier, are biased at almost the same levels.

The current rate in the constant current circuits $CS_1$ and $CS_{11}$, which are provided on the emitters of the individual transistors $Q_3$ and $Q_{13}$, are set to be the same. Then, the voltage $V_2$, which is determined by the equation $V_1 - V_{beQ3}$, is applied to the base of the transistor $Q_4$, and the voltage $V_{12}$, which is determined by the equation $V_{11} - V_{beQ13}$, is applied to the base of the transistor $Q_{14}$.

The differential amplifier 15 is composed of the transistors $Q_4$ and $Q_{14}$ connected as a differential pair, the resistors $R_5$ and $R_{15}$ for setting the dynamic range, the load resistors $R_4$ and $R_{14}$, and a constant current circuit $CS_0$. The values of the individual resistors are set so that $R_5 = R_{15}$ and $R_4 = R_{14}$. Then, when there is no input, the voltages $V_2$ and $V_{12}$ are at the same level, and the transistors $Q_4$ and $Q_{14}$ are balanced. Conversion circuits 2 and 12 feed a bias voltage at the same level to each of the transistors $Q_3$ and $Q_{13}$, and both of these transistors are kept in the same balanced state. In this case, the respective collector currents $I_2$ and $I_{12}$ also become equal, and the current $I_0$, which is the sum of these collector currents, flows in the constant current circuit $CS_0$. In such a balanced state, the voltage drop across the resistor $R_4$ and the voltage drop across the resistor $R_{14}$ become identical. Hence, there is no difference in voltage between the output signals $V_{01}$ and $V_{011}$ from differential amplifiers, forming, as it were, a state with no output.

Figure 3A:
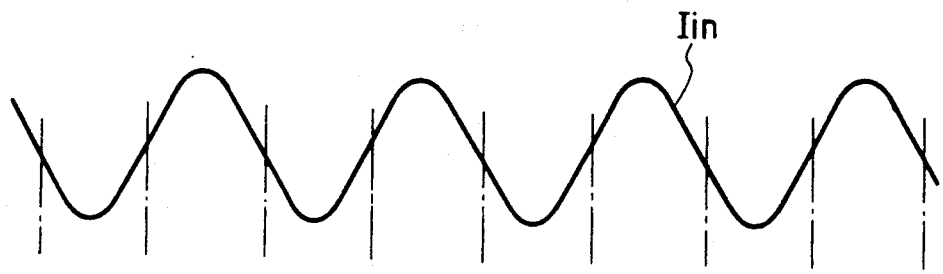
FIGS. 3A-3C are waveforms illustrating the operations of the circuits of FIGS. 1, 2, 9, and 10.

Next, circuit operations performed when an input current $I_{in}$ is provided will be described. When the input current $I_{in}$ shown in FIG. 3A is fed to the input terminal T, the divided electric currents, each being $I_{in}/2$, are fed as the base currents to the transistors $Q_1$ and $Q_{11}$. In the following, circuit operations are described one by one in a regular sequence, starting with the current amplifying circuit 1 and ending with the differential amplifier 15. The transistor $Q_1$ performs current amplification, and the resistors $R_2$ and $R_3$ perform current-voltage conversion by what people versed in the art call "IR drop".

Figure 3B:
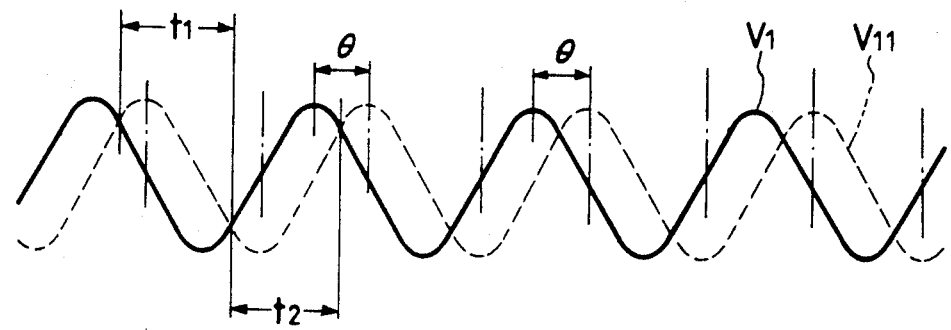

That is, when the current $I_{in}/2$ is fed to the base of the transistor $Q_1$, the collector current $I_{cl}$, current-amplified by the ratio of $h_{fe}$ ($h_{fe}$ as used here represents the emitter ground current amplification factor) flows via the resistors $R_2$ and $R_3$. Then, the collector voltage $V_1$ of the transistor $Q_1$, which is the base voltage for the transistor $Q_3$, attains the voltage determined by the equation $(R_2+R_3) \cdot I_{cl}$. The level of that voltage changes in opposite phase in correspondence to the input current $I_{in}$, as shown in FIGS. 3A and 3B.

However, as the capacitor $C_{11}$, which forms the phase adjusting circuit 14, is connected between both ends of series-connected resistors $R_{12}$ and $R_{13}$, the change in the level of the voltage $V_{11}$ is adjusted in phase (delayed by the time T) in correspondence to the capacitance of the capacitor $C_{11}$. The phase-adjusted voltage $V_{11}$ then is transmitted to the base of the transistor $Q_{13}$. Consequently, the voltage signal $V_{12}$, which is in opposite phase in relation to the input current $I_{in}$ and which has been phase adjusted, is fed to the base of the transistor $Q_{14}$, which forms part of the differential amplifier 15.

In other words, both the voltage signal $V_2$ and the voltage signal $V_{12}$ are adjusted in phase by the time T in relation to the input current $I_{in}$. However, if $V_2=V_{12}$, the differential amplifier 15 will not be able to perform its amplifying operation. Therefore, in the preferred embodiment presently being described, the capacitance values of the capacitors $C_1$ and $C_{11}$ are such that $C_1 < C_{11}$, as mentioned above, e.g, at approximately $C_1 = 35$ pF and $C_{11} = 40$ pF, so that a phase difference $\theta$ also is formed between the voltage signals $V_2$ and $V_{12}$. In the manner described above, the voltage signals $V_2$ and $V_{12}$, which are at the same voltage level and are adjusted to have a phase difference $\theta$, are fed to the base of the transistors $Q_4$ and $Q_{14}$, which form the differential amplifier 15.

Figure 3C:
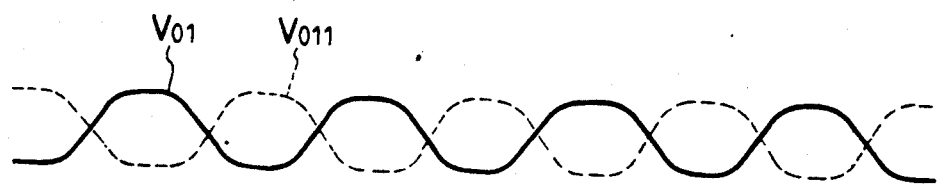

Now, the operation of the differential amplifier 15 will be described. In the time interval of time $t_1$ shown in FIG. 3B, $V_2 < V_{12}$. Accordingly, with the voltage-comparing operations of the transistors $Q_4$ and $Q_{14}$, $I_2 < I_{12}$. Then, as for the respective voltage drops in the load resistors $R_4$ and $R_{14}$, $V_{o1} > V_{o11}$, as shown in FIG. 3C.

Subsequently, in the time interval $t_2$, $V_2 > V_{12}$, and $V_{o1} < V_{o11}$. As the circuit operations described above are performed repetitively after $t_1$ and $t_2$, the output signals $V_{o1}$ and $V_{o11}$, which are mutually opposite in phase, are obtained in succession as shown in FIG. 3C, in correspondence to the changes in the input current $I_{in}$.

Now, the inventive preamplifier just described is designed to achieve its high gain by current amplification in the current amplifying circuits 1 and 11, and further by amplification in the differential amplifier 15. Owing to this performance feature, even if the input current $I_{in}$ is a weak and small current, on the order of approximately several $\mu$A, the output signals $V_{o1}$ and $V_{o11}$ will be amplified to a voltage level of several mV to several hundred mV, and thus the preamplifier can function adequately. In addition, with the characteristics of the differential amplifier 15 for the elimination of signals having the same phase, this preamplifier can achieve a favorable signal-to-noise ratio. The preamplifier also performs highly stable circuit operations, as it is liable to almost no influence by changes in temperature and fluctuations in the power from the power source.

Next, the noise eliminating operation in the preamplifier will be described with reference to FIGS. 4 and 5.

Now, the capacitors $C_1$ and $C_{11}$ have the phase adjusting effect mentioned above, and also have the effect of filtering the high frequency components, together with the resistors $R_2$ and $R_3$ and the resistors $R_{12}$ and $R_{13}$, respectively. Therefore, the differential amplifier 15 will be fed with the voltage signals $V_2$ and $V_{12}$ after the noise components contained in the input current $I_{in}$ are removed from the signals.

Figure 4:
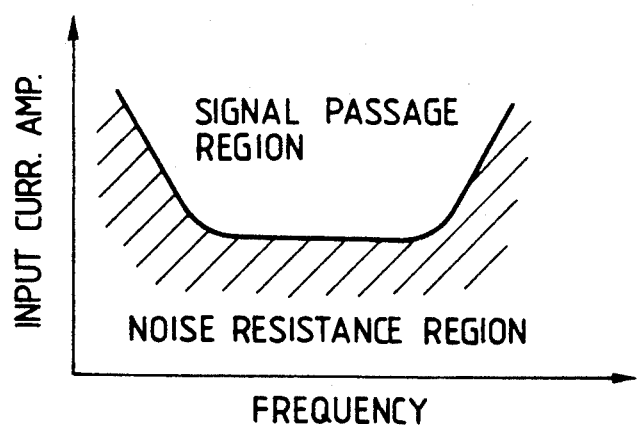
FIG. 4 is a noise resistance characteristics chart.
Figure 5:
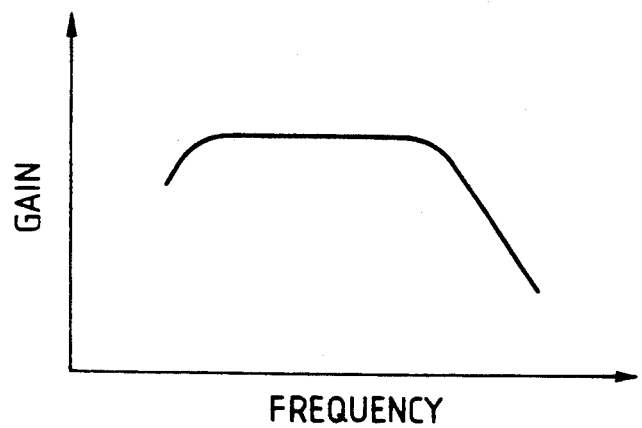
FIG. 5 is a frequency characteristics chart.

Then, since the differential amplifier 15 performs its amplifying operations in response to a voltage difference between the voltage signals $V_2$ and $V_{12}$ from which the noise components thus have been removed, the amplification of the noise components in a given frequency range is reduced considerably, as indicated by the slant lines in FIG. 4, and the frequency components of the input current $I_{in}$ are passed through in the particular frequency range. As the result, the overall frequency characteristics of the preamplifier are such that the preamplifier will have a high gain in the desired frequency range, as shown in FIG. 5, above all with the advantage that the noise components in the high frequency region can be cut off.

However, depending on the modes of use of the preamplifier, the input current $I_{in}$ will not always be weak and small, and sometimes it will happen that the preamplifier will receive a high input following a small input current. In such a case, the output signal will be in a saturated state unless the preamplifier is provided with a gain control function, and yet it is not desirable to set up a special control circuit because of the resulting complicated circuit construction.

Therefore, the preamplifier according to this aspect of the invention is constructed so as to be capable of performing the gain control function mentioned above with the transistors $Q_2$ and $Q_{12}$, which are provided to perform voltage clamping in response to the voltages at both ends of the resistors $R_3$ and $R_{13}$.

Figure 6:
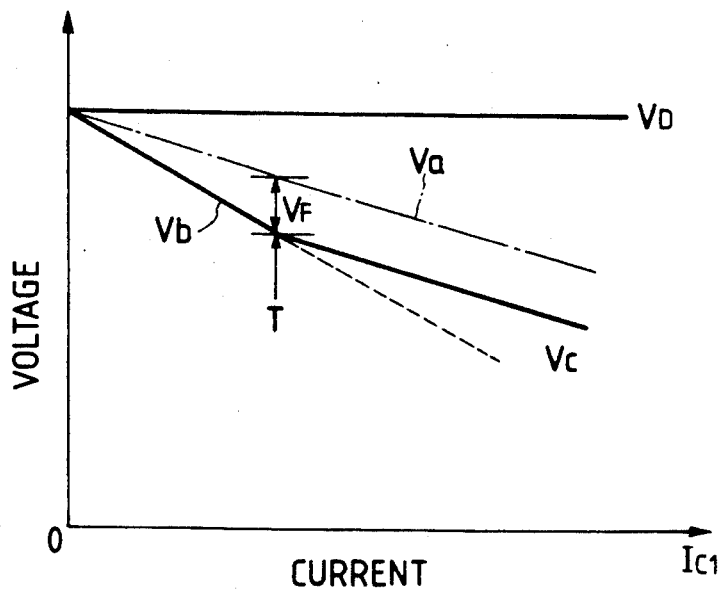
FIG. 6 is a voltage characteristics chart illustrating clamping operations of the circuits of FIGS. 1, 2, 9, 10, 11, and 12.

In the following, the operations of the transistors $Q_2$ and $Q_{12}$ will be described with reference to FIG. 6. When the input current $I_{in}$ increases, the collector current $I_{cl}$ also increases, and, correspondingly, the voltage drop across the resistor $R_2$, as shown by $V_a$ in FIG. 6, and the voltage drop across the resistor $R_3$, shown as $V_b$ in FIG. 6, will increase. As a result of such increases, the collector voltage $V_1$ of the transistor $Q_1$, which is the same as the base voltage of the transistor $Q_3$, gradually changes to a lower level as seen from the power source $V_{cc}$. If the voltage $V_1$ continues to change to a lower level the transistors $Q_3$ and $Q_4$ may become reversely-biased in some cases. However, by the action of the transistor $Q_2$, the preamplifier shown in this embodiment can prevent the occurrence of the above-mentioned inadequate state.

Specifically, when the voltage drop $V_b$ of the resistor $R_3$ increases gradually and exceeds $V_{be}$, which is the voltage between the base and the emitter of the transistor $Q_2$, then the transistor $Q_3$ will be turned ON. While the voltages at the two ends of the resistor $R_3$ will begin to be clamped at $V_{be}$ as from this point T in time, the voltage drop $V_a$ in the resistor will increase in relation to the collector current $I_{cl}$. Accordingly, the voltage $V_1$ will come to be determined by the equation, $V_1=V_{cc}-(V_a+V_{BE})$, and the voltage $V_1$, which is expected essentially to decline as indicated by the dotted line, changes as shown by the solid line as from the point T in time.

Now, while the voltages at both ends of the resistor $R_3$ are clamped in this manner, the change in the collector current $I_{cl}$ corresponding to the input current $I_{in}$ shows itself in the voltage $V_1$ in the form of a change in the decline of voltage in the resistor $R_2$. Therefore, even if the input current $I_{in}$ should become a high input, the portion of such a change is converted into a low level component and transmitted to the transistor $Q_4$, which forms part of the differential amplifier 15.

Also, in the current-voltage conversion circuit 11 in the meantime, the same clamping operations as those just mentioned are performed with respect to the resistor $R_{13}$ and the transistor $Q_{12}$ when the input current $I_{in}$ becomes high. Then, part of the change in the input current $I_{in}$ is converted into a low level component, and is processed further to have its phase adjusted. Thereafter, the phase adjusted component is fed to the base of the transistor $Q_{14}$, which forms part of the differential amplifier 15. The differential amplifier 15 performs the same amplifying operations as those mentioned above, and yields the output signals $V_{01}$ and $V_{011}$ of opposite phase, even when a high input is fed thereinto. In this regard it also is feasible to use $Q_2$ and $Q_3$ as diodes by connecting their collectors to the base side.

Figure 8:
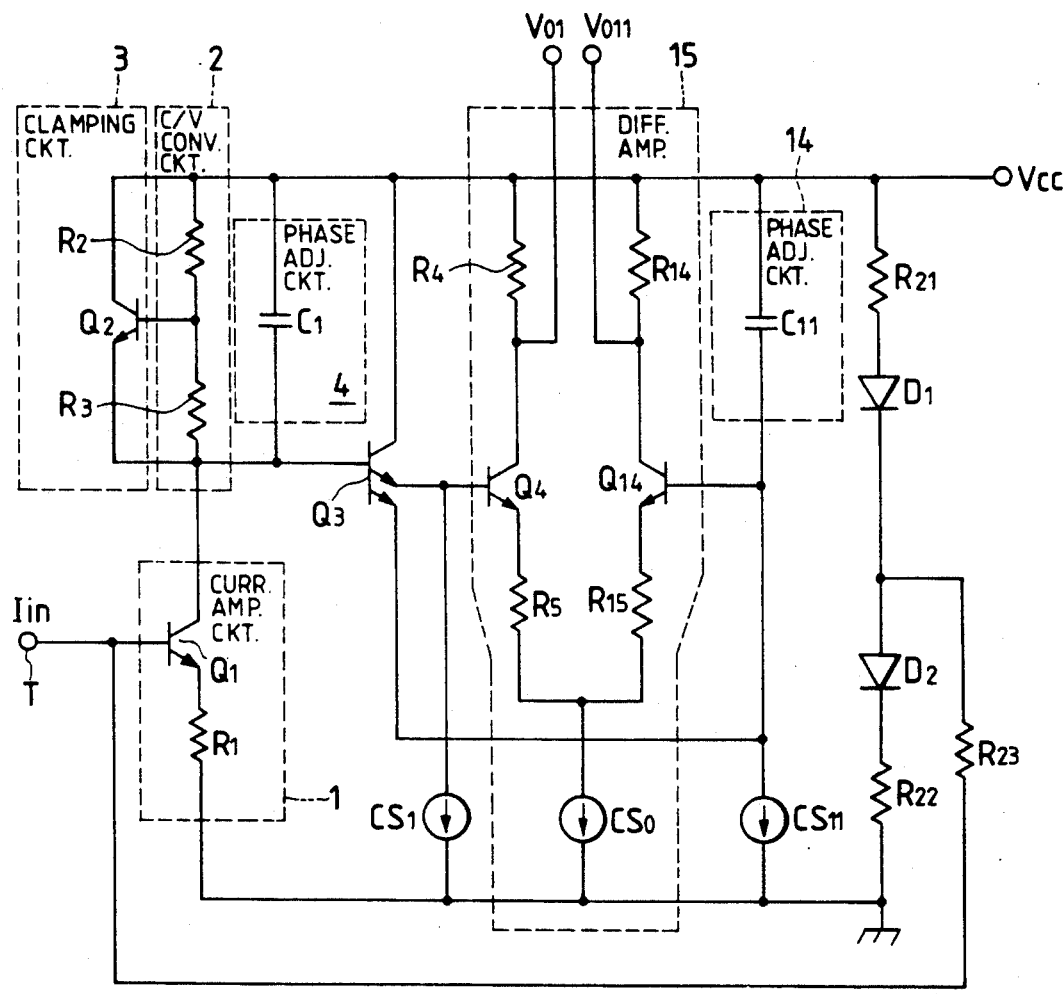
FIG. 8 is a circuit diagram showing a specific example of the preamplifier of FIG. 7.

Next, a description will be provided of a second preferred embodiment of the invention with reference to FIGS. 7 and 8. The basic difference between this embodiment and the first embodiment consists in simplification of the circuit construction in this embodiment by the common use of a current amplifying circuit, a current-voltage conversion circuit, and a clamping circuit. Accordingly, for convenience in description, those circuits in this example which perform the same operations as those in the first embodiment are numbered in the same way.

First, the overall circuit construction will be described with reference to FIG. 7. The current amplifying circuit 1, the current-voltage conversion circuit 2, and the clamping circuit 3 perform the same circuit operations as those described above. Then, the voltage $V_1$, which is phase adjusted in the first phase adjusting circuit 4, is fed to one of the input terminals of the differential amplifier 15 and also is fed to the second phase adjusting circuit 14. Furthermore, the phase-adjusted voltage $V_2$ is fed to the other input terminal of the differential amplifier 15.

Next, referring to FIG. 8, the preamplifier shown in this preferred embodiment performs its current amplification with one current amplifying circuit. Therefore, the input current $I_{in}$ is fed, without being divided into two parts, to the base of the transistor $Q_1$.

The resistors $R_2$ and $R_3$ generate the voltage signal $V_1$ by performing current-voltage conversion, and the voltage signal $V_1$ is phase adjusted (delayed) by the capacitor $C_1$, which forms the phase adjusting circuit 4, and then is fed to the base of the transistor $Q_3$. The emitter of the transistor $Q_3$ is formed in a double-emitter configuration, and the voltage signal $V_2$ after phase adjustment is fed from the first of these emitters to the base of the transistor $Q_4$, which forms part of differential amplifier 15.

Meanwhile, the phase-adjusted voltage signal is fed from the second emitter of the transistor $Q_3$ to the base of the transistor $Q_{14}$, which forms part of the differential amplifier 15. This voltage signal has the same phase as the voltage signal $V_2$ mentioned above. Accordingly, the voltage signal fed from the second emitter is phase adjusted by the capacitor $C_1$, thereby being turned into a voltage signal $V_{12}$ having a desired phase difference $\theta$ in relation to the voltage signal $V_2$ mentioned above, and then is fed to the base of the transistor $Q_{14}$.

Thus, the voltage signals $V_2$ and $V_{12}$, which have a phase difference $\theta$ as described in detail with reference to FIG. 3, are fed to the respective bases of the transistors $Q_4$ and $Q_{14}$ which perform the voltage comparison. The differential amplifier 15 performs the same amplifying operations as those mentioned above and generates the output signals $V_{01}$ and $V_{011}$ of opposite phases.

The preamplifier just described offers the following advantages. First, the preamplifier is capable of yielding a high gain with the amplifying operations of the current amplifying circuit 1 and the differential amplifier 15. Second, the clamping circuit 3 provided this preamplifier can convert the voltage signals $V_2$ and $V_{12}$ into changes at a low level at the same time, in case the input current $I_{in}$ changes to a high input, and the preamplifier can generate output signals even when a high input is fed into its circuit. Also, the preamplifier has such a simple circuit construction that it can be formed readily into an integrated circuit.

Various modifications within the scope and spirit of the invention as described in FIGS. 1–8 are possible. For instance, the capacitors forming the phase adjusting circuits have their capacitance values fixed, so that the circuits may operate within a specified frequency range with respect to the input signals (i.e., in current and electric charge). However, the phase adjusting circuits may be constructed with their capacitors installed externally, to operate at a variable capacitance value, so that the circuit may operate in a way suitable for an arbitrarily selected frequency.

Further, the semiconductor elements which comprise this preamplifier are not limited to the bipolar transistors mentioned above; rather, the preamplifier may be constructed with MOS transistors and with an integrated circuit formed of a mixture of bipolar transistors and MOS transistors. Also, the preamplifier may be constructed with such other elements as bipolar transistors, CMOS transistors. GaAs (gallium arsenide) elements, or Josephson devices.

Moreover, in the embodiments just described the capacitors forming the phase adjusting circuit are connected to the power source side but instead, they may be connected to the ground (GND) side.

Still further, the preamplifier described above can be used in an extensive range of applications in all electronic appliances which are required to detect electric currents in excess of several $\mu A$ and to convert such currents into voltage, such as preamplifiers for scanners, electric charge detecting circuits for CCD area sensors, and preamplifiers for optical communication receivers.

As described in the foregoing the preamplifier according to this aspect of the invention is constructed in such a way that it feeds the first voltage signal, which it obtains through phase adjustment of the voltage signal generated by its conversion of the input current and the electric charge, to one of the input terminals of the differential amplifier, and also feeds the second voltage signal which it obtains through its further phase adjustment of the first voltage signal, to the other input terminal of the differential amplifier, so that it generates an output signal that is amplified on the basis of the difference in voltage between the input terminals.

With the preamplifier constructed as just described, it is possible to control the gain, the frequency characteristics, and the elimination of the noise components by setting the difference in phase between the first voltage signal and the second voltage signal as desired by means of the phase adjusting circuits. Therefore, the preamplifier renders it unnecessary to provide any control circuit or the like to perform the various types of control mentioned above. Therefore, the present invention can realize a preamplifier having a simple circuit construction, and yet attaining a favorable signal-to-noise ratio.

Figure 9:
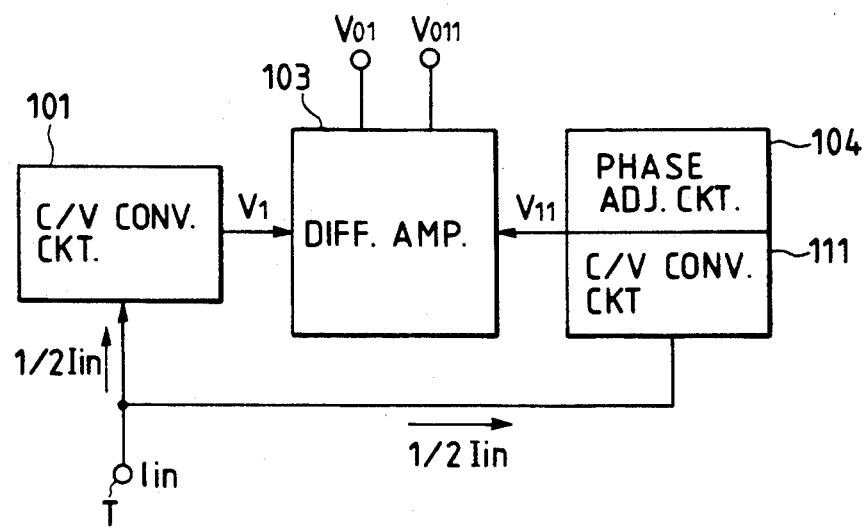
FIG. 9 is a circuit block diagram showing the basic construction of the preamplifier according to a third embodiment of the invention.

A third embodiment of the invention now will be described with reference to FIGS. 9 and 10. Current-voltage conversion circuits 101 and 111 amplify the input current $I_{in}$ fed as the input signal, and thereafter convert the amplified input current into voltage signals, feeding the voltage signals to a current switching type differential amplifier 103 (more simply, a "differential amplifier"). Moreover, as the input impedance of the current-voltage conversion circuits 101 and 111 is set to be the same, the current, divided into two parts, $I_{in}/2$, serves as the input current into each of the current-voltage conversion circuits 101 and 111. The voltage signal $V_1$, which is obtained from the current-voltage conversion circuit 101, is fed to one of the input terminals of the differential amplifier 103.

The current-voltage conversion circuit 111 feeds the voltage signal $V_{11}$, which corresponds to the input current $I_{in}/2$, to the other input terminal of the differential amplifier 103. However, if the voltage signals $V_1$ and $V_{11}$ have the same phase and are at the same level, the differential amplifier 103 is not able to generate its amplified output signal. Therefore, a phase adjusting circuit 104 is provided in connection with the current-voltage conversion circuit 111, and with these, the present preamplifier is constructed to feed a properly phase-adjusted voltage signal $V_{11}$ to the other input terminal of the differential amplifier 103 at the same time as it performs its current-voltage conversion. The differential amplifier 103 is constructed so as to generate the output signals $V_{01}$ and $V_{011}$, which correspond to the difference in level between the voltage signals $V_1$ and $V_{11}$ on the basis of the feeding of the voltage signals $V_1$ and $V_{11}$ with a desired phase difference to the input terminals of the differential amplifier 103.

Figure 10:
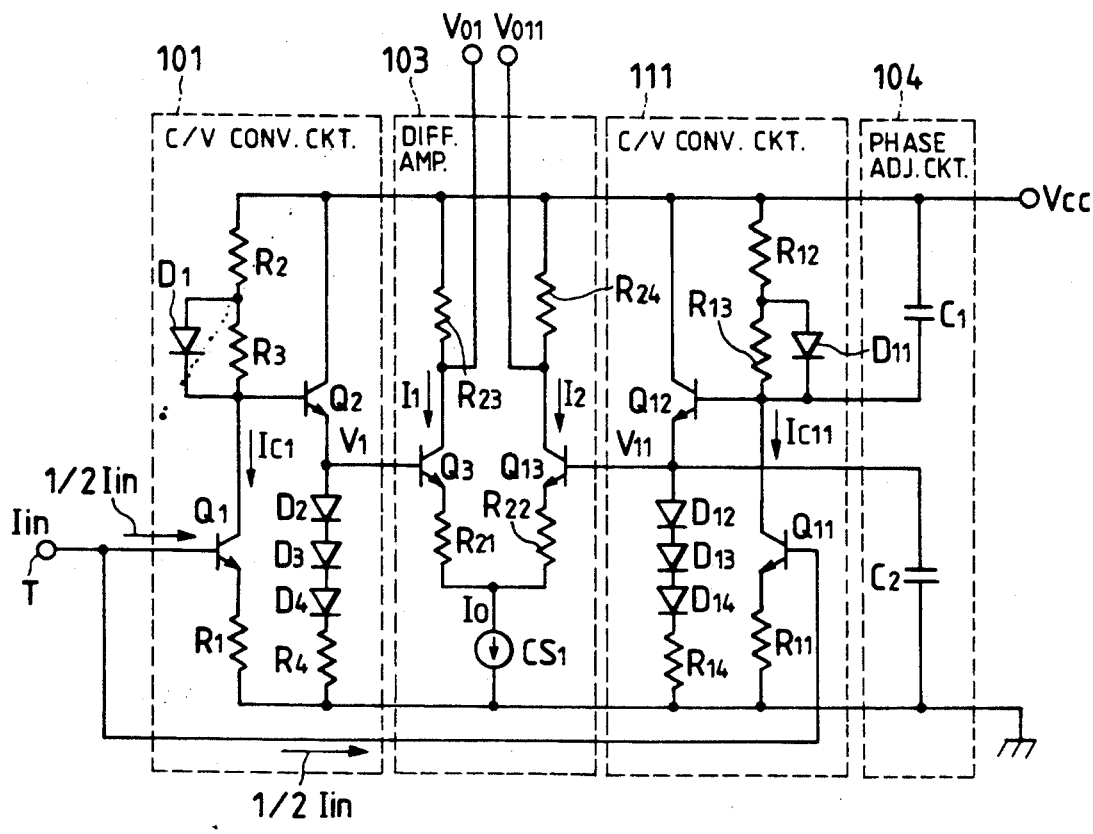
FIG. 10 is a circuit diagram showing a specific example of the preamplifier of FIG. 9.

Next, with reference to FIG. 10, a description will be provided of the state of balance at the time when no input is applied. Then, with reference to FIGS. 3 and 6, a description will be provided of the operations which the circuits perform when input signals are fed thereinto. In this regard, it should be noted that the preamplifier shown in FIG. 10 is constructed with semiconductor integrated circuits.

As illustrated in FIG. 10, the input circuit for the current-voltage conversion circuits 101 and 111 is constructed of NPN transistors $Q_1$ and $Q_{11}$ for current amplification, and is constructed in such a way as to set the input impedance at approximately the same value, with the resistances of the emitter resistors $R_1$ and $R_{13}$ being equal. Now, the operations of the circuits will be described below in normal sequence, starting with the current-voltage conversion circuit 101. When there is no input, the transistor $Q_1$ remains turned OFF, but the base current is fed to the transistor $Q_2$ via resistors $R_2$ and $R_3$ connected in series between the collector and the power source, and therefore the transistor $Q_2$ is turned ON. Consequently, the prescribed current flows in the series circuit formed of the diodes $D_2$ through $D_4$ and the resistor $R_4$, which are provided between the emitter and the ground (GND). The diodes $D_2$ through $D_4$ operate as level shifters, and the voltage formed with the addition of $3V_F$ (wherein $V_F$ represents the voltage of the diodes in the forward direction) to the amount of the voltage drop in the resistor $R_4$ is applied as the bias voltage of the transistor $Q_3$ incorporated in the construction of the differential amplifier 103.

Meanwhile, in the current-voltage conversion circuit 111, the transistor $Q_{11}$ remains turned OFF when no input is applied to it, but the transistor $Q_{12}$ is turned ON as a base current is fed to it via the resistors $R_{12}$ and $R_{13}$. Thus, the voltage set by the resistor $R_{14}$ and the diodes $D_{12}$ through $D_{14}$, which operate as level shifters, is applied as the bias voltage for the transistor $Q_{13}$, which forms part of the differential amplifier 103. Moreover, when there is no input, the effect of the diodes $D_1$ and $D_{11}$ connected in parallel to the resistors $R_3$ and $R_{13}$, and the effect of the capacitors $C_1$ and $C_3$ which form the phase adjusting circuit 104 is negligible.

The differential amplifier 103 is comprised of the transistors $Q_3$ and $Q_{13}$ connected as a differential pair, the resistors $R_{21}$ and $R_{22}$ which set the dynamic range, load resistors $R_{23}$ and $R_{24}$, and a constant current circuit CS1. The values of the individual resistors are set such that $R_{21}=R_{22}$ and $R_{23}=R_{24}$.

When there is no input, the current-voltage conversion circuits 101 and 111 feed a bias voltage at the same level to each of the transistors $Q_3$ and $Q_{13}$, and both of these transistors are kept in the same balanced state. In this case, the current $I_1$, which is fed from the power source and flows through the current path comprised of the resistor $R_{23}$, the transistor $Q_3$, and resistor $R_{21}$, and current $I_2$, which flows through the current path comprised of the resistor $R_{24}$, transistor $Q_{13}$, and resistor $R_{22}$, are at the same current rate, and their sum, i.e, the current $I_0$, flows into the constant current circuit $CS_1$.

In such a balanced state, the voltage drops in the resistors $R_{23}$ and $R_{24}$ are equal, so that the difference in voltage between the output signals $V_{01}$ and $V_{02}$ is eliminated, and there will be no output. Also, no voltage difference appears between the output signals $V_{01}$ and $V_{02}$, even if the bias voltage is made variable at the same level between the transistors $Q_3$ and $Q_{13}$ in the balanced state as mentioned above.

Next, a description will be provided of the circuit operations when there is an input signal. When the input current $I_{in}$ shown in FIG. 3A is fed to the input terminal T, the current, divided into two parts, i.e. $I_{in}/2$, is fed as the base current for the transistors $Q_1$ and $Q_{11}$. The operations of the current-voltage conversion circuit 101 will be described first. The transistor $Q_1$ performs current amplification, and the resistors $R_2$ and $R_3$ perform the current-voltage conversion by what people versed in the art call "IR drop".

That is to say, when the current $I_{in}/2$ is fed to the base of the transistor $Q_1$, the collector current $I_{c1}$, current-amplified by the ratio of $h_{fe}$, flows via resistors $R_2$ and $R_3$. Then, the collector voltage of the transistor $Q_1$, which is the base voltage for the transistor $Q_2$, attains the voltage determined by the equation $(R_1+R_2)\cdot I_{c1}$, and the level of that voltage changes in opposite phase in correspondence to the collector current $I_{cl}$ or, in other words, to the input current $I_{in}$. The diode $D_1$ is connected to both ends of the resistor $R_3$; the purpose and operation of the diode $D_1$ will be described in detail later.

Then, as the change in the base voltage of the transistor $Q_2$ is transmitted in phase to the emitter, the voltage signal $V_1$, which is in opposite phase in relation to the input current $I_{in}$ as shown in FIGS. 3A and 3B, will be fed to the base of the transistor $Q_3$.

In the current-voltage conversion circuit 111, in the meantime, the transistor $Q_{11}$ performs current amplification by the $h_{fe}$ ratio, and the collector current $I_{cll}$ as determined by the equation $(I_{in}/2) \cdot h_{fe}(Q_{11})$ flows through the resistors $R_{12}$ and $R_{13}$. Consequently, the base voltage of the transistor $Q_{12}$, which is the collector voltage of the transistor $Q_{11}$, changes to the voltage level determined by the equation $(R_{12}+R_{13}) \cdot I_{cll}$. However as the capacitor $C_1$ is connected between the power source and the base of the transistor $Q_{12}$, the change in the base voltage is adjusted in phase (delay) in correspondence to the capacitance of the capacitor $C_1$. In this regard the capacitance in the gate connection at the time of the formation of the IC can be utilized as the capacitor $C_1$, and the capacitance value is selected on the basis of the frequency and delay time of the input signal, which is the range of phase adjustment.

As mentioned above, the phase adjusted base voltage of the transistor $Q_{12}$ is transmitted in the same phase to the emitter, and the capacitor $C_2$ is connected between this emitter and the base of the transistor $Q_{13}$, the capacitor $C_2$ forming part of the phase adjusting circuit 104 Therefore, the voltage signal $V_{11}$, which is fed to the base of the transistor $Q_{13}$, is further adjusted in phase by the capacitor $C_2$. As a result, the voltage signal $V_{11}$, which is adjusted to have a phase difference $\theta$ in relation to the above-mentioned voltage signal $V_1$, is fed to the base of the transistor $Q_{13}$ as shown in FIG. 3B. Moreover, regarding the phase adjustment made for the phase difference $\theta$, the voltage signal $V_{11}$ is basically delayed by a time corresponding to the phase difference. With the operations performed in the manner described above, the voltage signals $V_1$ and $V_{11}$ at the same voltage level and as adjusted to the phase difference $\theta$ are fed to the base of the transistors $Q_3$ and $Q_{13}$, which form the differential amplifier 103.

Next, a description will be provided of the operation of the circuits in the differential amplifier 103. In the time $t_1$ shown in FIG. 3B, the voltage signals $V_1$ and $V_{11}$ have the relationship $V_1 < V_{11}$. Accordingly with the voltage-comparing operations of the transistors $Q_3$ and $Q_{13}$, the current flow rates of the currents $I_1$ and $I_2$ will be such that $I_1 < I_2$. Then, the respective voltage drops in the load resistors $R_{23}$ and $R_{24}$, that is, the voltage levels of the output signals $V_{01}$ and $V_{011}$, will be such that $V_{01} > V_{011}$, as shown in FIG. 3C.

Subsequently, in the time $t_2$, the voltage levels of the voltage signals $V_1$ and $V_{11}$ change to $V_1 > V_{11}$, and the current flow rates of the current $I_1$ and $I_2$ will be such that $I_1 > I_2$, and the voltage levels of the output signals $V_{01}$ and $V_{011}$ are such that $V_{01} < V_{011}$. As the circuit operations described above are performed repetitively after the time $t_2$, the output signals $V_{01}$ and $V_{011}$, which are mutually opposite in phase, are obtained in succession, as shown in FIG. 3C, in correspondence to the changes in the input current $I_{in}$.

Now, the preamplifier just described is designed to achieve its high gain by the effect of the current amplification in the current-voltage conversion circuits 101 and 111, and by the effect of amplification in the differential amplifier 103. Owing to this performance feature, even if the input current $I_{in}$ is a weak and small current on the order of approximately several $\mu A$, the output signals $V_{01}$ and $V_{011}$ will be amplified to the voltage level of several mV to several hundred mV and thus this preamplifier can amply perform its functions. In addition, with the characteristics of the differential amplifier 103 for eliminating signals having the same phase, this preamplifier can achieve a favorable signal-to-noise ratio. The preamplifier also performs highly stable circuit operations as it is liable to almost no influence by changes in temperature and fluctuations in power from the power source.

However, depending on the modes of use of the preamplifier, the input current $I_{in}$ will not always be weak and small and sometimes it will happen that the preamplifier will receive a high input following a small input current. In such a case, the output signal will be in a saturated state unless the preamplifier is provided with a gain control function, and yet it is not desirable to set up a special control circuit because it would result in complicated circuit construction.

Therefore, the preamplifier according to this aspect of the invention is constructed to be capable of performing the gain control function mentioned above with the diodes $D_1$ and $D_{11}$ connected in parallel to the resistors $R_3$ and $R_{13}$.

In the following, the operations of the diodes are described with reference to FIG. 6. When the input current $I_{in}$ increases, the collector current $I_{cl}$ also increases, and, correspondingly, the voltage drop $V_a$ in the resistor $R_2$ and the voltage drop $V_b$ in the resistor $R_3$ will increase. As a result, the collector voltage $V_c$ of the transistor $Q_1$, which is the base voltage of the transistor $Q_2$, gradually changes to a lower level as seen from the power source. If the voltage $V_c$ continues to change to a lower level, the transistor $Q_2$ may become reversely biased in some cases. However, by the action of the diode $D_1$, the preamplifier shown in the present embodiment can prevent the occurrence of the above-mentioned inadequate state.

Specifically, when the voltage drop $V_b$ of the resistor $R_3$ increases gradually and exceeds the forward voltage $V_F$ of the diode $D_1$, then the diode $D_1$ will become forward-biased, and thereby is turned ON. While the voltages at the two ends of the resistor $R_3$ will begin to be clamped at $V_F$ as from this time T, the voltage drop $V_a$ across the resistor will increase in relation to the collector voltage $I_{cl}$. Accordingly, the voltage $V_c$ will be determined by the equation $V_c = V_a + V_F$, and the voltage $V_c$, which essentially is expected to decline as indicated by the dotted line, changes as shown by the solid line as from the point time T.

Now, while the voltages at both ends of the resistor $R_3$ are clamped in this manner, the change in the collector voltage $I_{cl}$ corresponding to the input current $I_{in}$ shows itself in the voltage $V_c$ in the form of a change in the voltage drop in the resistor $R_2$. Therefore, even if the input current $I_{in}$ should become high, the portion of such a change is converted into a low level component and transmitted to the transistor $Q_3$, which forms part of the differential amplifier 103.

Also, in the current-voltage conversion circuit 111 in the meantime, the same clamping operations as those mentioned above are performed with respect to the resistor $R_{12}$ and the diode $D_{11}$ when the input current $I_{in}$ grows into a high input. Then, the part of the change in the input current $I_{in}$ is converted to a low level component, is processed further for phase adjustment, and thereafter is fed to the base of the transistor $Q_{13}$, which forms the differential amplifier 103.

The differential amplifier 103 performs the same amplifying operations as those mentioned above and yields the output signals $V_{01}$ and $V_{011}$ in opposite phase even at the time when a high input is fed into its circuit.

Figure 11:
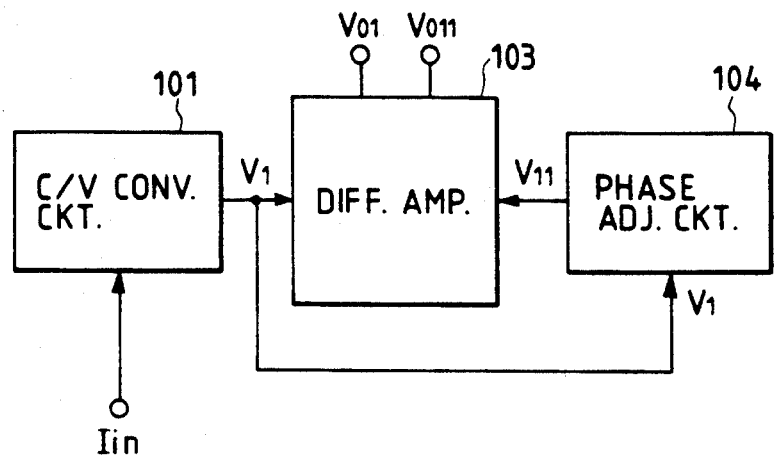
FIG. 11 is a circuit block diagram illustrating a fourth embodiment of the invention.
Figure 12:
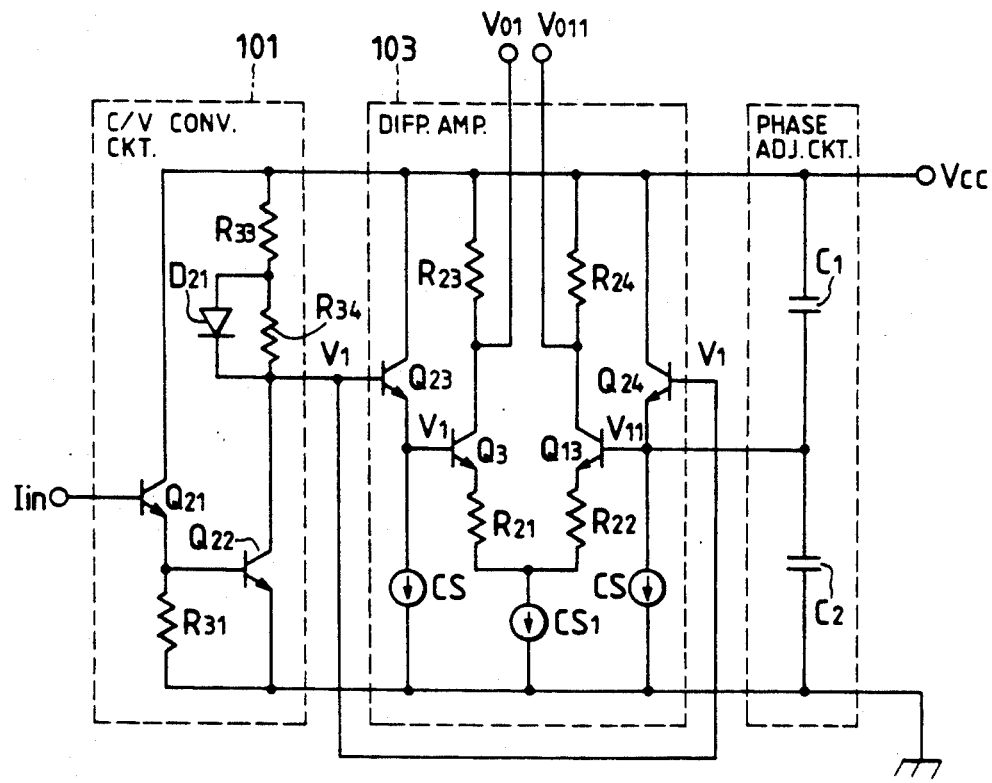
FIG. 12 is a circuit diagram showing a specific example of the embodiment of FIG. 11.

Next, a description will be provided of a fourth preferred embodiment of the invention with reference to FIGS. 11 and 12. The basic difference between this embodiment and the preceding embodiment consists in the simplification of circuit construction in this embodiment by the use of a single current-voltage conversion circuit. Accordingly, for convenience in description, those circuits in this example which perform the same operations as those in the preceding embodiment are shown with the same reference numbers attached to them.

First, the overall circuit construction will be described with reference to FIG. 11. The current-voltage conversion circuit 101 converts the input current $I_{in}$ into a voltage signal $V_1$, which in turn is fed to one of the input terminals of the differential amplifier 103, and to the phase adjusting circuit 104. The phase adjusting circuit 104 is so constructed so as to feed the voltage signal $V_{11}$, whose phase the phase adjusting circuit 104 adjusts to the desired phase difference $\theta$ in relation to the voltage signal $V_1$, to the other input terminal of the differential amplifier 103.

Now, circuit operations will be described with reference to FIG. 12. The input current $I_{in}$ is fed to the base of the input transistor $Q_{21}$ and then is fed from its emitter to the base of the transistor $Q_{22}$ for current amplification. Moreover, an emitter resistor $R_{31}$ is connected between the emitter and the ground (GND) of the input transistor $Q_{21}$, forming a circuit construction designed to set the input impedance at a high level as viewed from the base.

The resistors $R_{33}$ and $R_{34}$ obtain the voltage signal $V_1$ by performing current-voltage conversion, and the voltage signal $V_1$ is fed to the base of each of the transistors $Q_{23}$ and $Q_{24}$, which form the differential amplifier 103. Moreover, the diode $D_{21}$ performs the same clamping operations as those of the diodes $D_1$ and $D_{11}$ described with respect to the preceding embodiment.

The transistor $Q_{23}$ transmits the voltage signal $V_1$ in phase to the base of the transistor $Q_3$. The transistor $Q_{24}$ transmits the voltage signal $V_1$ in phase to the base of the transistor $Q_{13}$, and, as the phase-adjusting capacitors $C_1$ and $C_2$ are connected to the base of the transistor $Q_{13}$, the voltage signal $V_1$ is adjusted so as to have a phase difference $\theta$ and thus becomes the voltage signal $V_{11}$.

Also in the present embodiment, the voltage signals $V_1$ and $V_{11}$, which have a phase difference $\theta$, are fed to the base of each of the transistors $Q_3$ and $Q_{13}$, which perform the voltage comparison.

The differential amplifier 103 performs the same amplifying operations as those mentioned above on the basis of the voltage difference between the voltage signals $V_1$ and $V_{11}$, and generates the output signals $V_{01}$ and $V_{011}$ in opposite phase.

The preamplifier described above offers the following advantages. First, the preamplifier is capable of yielding a high gain by the current amplification operation with the transistor $Q_{22}$, which forms part of the current-voltage conversion circuit 101, and the amplifying operation of the differential amplifier 103. Second, since the current-voltage conversion circuit 101 is provided with a clamping diode $D_{21}$, which converts the voltage signal $V_1$ to a low level change in case the input current $I_{in}$ changes to a high level, the preamplifier can generate output signals even when a high input is fed thereinto. Also, the preamplifier has such a simple circuit construction that it can be readily formed as an integrated circuit.

Figure 13:
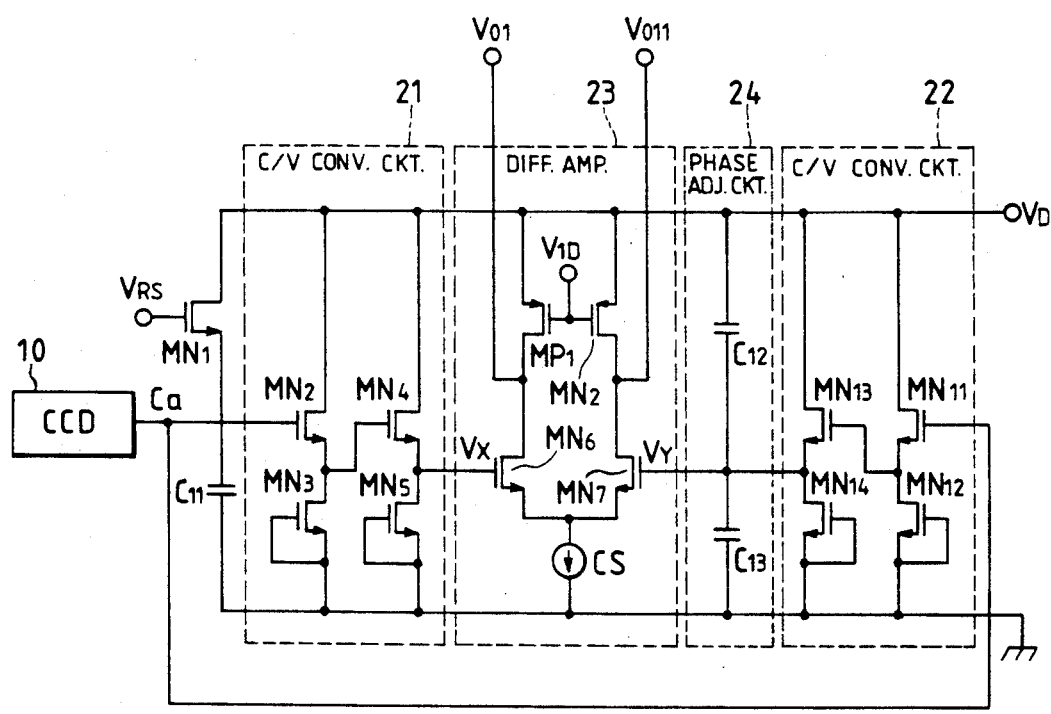
FIG. 13 is a circuit diagram of a fifth embodiment of the invention.

Next, a description will be provided of a fifth preferred embodiment of the invention with reference to FIG. 13. The preamplifier shown in this embodiment is constructed with MOS transistors instead of bipolar transistors.

The electric charge $C_a$, obtained in the form of an image signal picked up with an image pickup element such as a CCD, is accumulated in the electric charge-voltage conversion capacitor $C_{11}$. The capacitor $C_{11}$ converts the electric charge $C_a$ into a voltage V as determined by the equation $V = (Q/C)$, and, though the capacitor is shown separately in FIG. 13, it forms part of the electric charge-voltage conversion circuits 21 and 22, together with the voltage amplifying circuit at the subsequent stage.

Furthermore, the MOS transistor (which for convenience will be called simply "transistor") $MN_1$ is operated under switching control, with the resetting signal VRS fed to its gate, and performs the switching of the preamplifier between the set and reset states.

The electric charge-voltage conversion circuit 21 generates the voltage signal $V_x$ by its amplification of the voltage V obtained through conversion with the capacitor $C_{11}$, and this circuit is constructed to perform its amplifying operations with the transistors $MN_2$ and $MN_3$, which are connected to the source follower, and also the transistors $MN_4$ and $MN_5$, which also are connected to the source follower. Then, the voltage signal $V_x$, whose level changes in correspondence to the amount of the electric charge is fed to the gate of the transistor $MN_6$, which forms part of the differential amplifier 23.

The electric charge-voltage conversion circuit 22 is constructed so as to perform its amplifying operations with the transistors $MN_{11}$ and $MN_{12}$, which are connected to the source follower, and also with the transistors $MN_{13}$ and $MN_{14}$, which also are connected to the source follower. Then, the voltage signal $V_y$, which changes its level in correspondence to the amount of the electric charge, is fed to the gate of the transistor $MN_7$, which forms part of the differential amplifier 13, and, since the phase adjusting circuit 24 comprised of the capacitors $C_{12}$ and $C_{13}$ is provided at the gate of the transistor $MN_7$, the voltage signal $V_y$ assumes a phase difference in relation to the voltage signal $V_x$. As the result of this operation, the voltage signals $V_x$ and $V_y$, which have a phase difference, as explained with reference to FIG. 3B, are fed to the gate of each of the transistors $MN_6$ and $MN_7$.

The differential amplifier 23 is comprised of the transistors $MN_6$ and $MN_7$, which are connected to form a pair for differential amplification, a constant current circuit CS, and the transistors $MP_1$ and $MP_2$, which are fed with the prescribed bias voltage and work as the active loads on the transistors $MN_6$ and $MN_7$ to which the prescribed bias current is fed.

When the voltage levels of the voltage signals $V_x$ and $V_y$ are such that $V_x > V_y$, the transistor $MN_6$ is turned ON, holding the output signal $V_{01}$ at the low level and setting the output signal $V_{011}$ at the high level. On the other hand, if $V_x < V_y$, the transistor $MN_7$ is turned ON, holding the output signal $V_{011}$ at the low level and keeping the output signal $V_{01}$ at the high level. Thus, the preamplifier shown in this embodiment can generate the output signals $V_{01}$ and $V_{011}$ with changes in their levels in correspondence to the amount of the electric charge.

Now, since the preamplifier shown in this embodiment accumulates the electric charge generated from the CCD 10 and converts the charge into the voltage V, it is possible to find the maximum value of the voltage V in advance. Therefore, this preamplifier need not particularly be provided with the clamping diode which is fitted to the two preceding embodiments, and so this preamplifier permits an attempt at a simpler circuit construction. As the MOS transistors are driven not with current but with voltage, it also is possible to reduce power consumption.

Next a sixth embodiment of the invention will be described with reference to FIG. 14. In this regard, the preamplifier shown in this embodiment is constructed with the addition of the resistors $R_a$, $R_b$, and $R_c$ and the diodes $D_5$ through $D_7$ for the construction of an internal voltage source in the circuitry of the preamplifier in the embodiment of FIG. 10.

Figure 14:
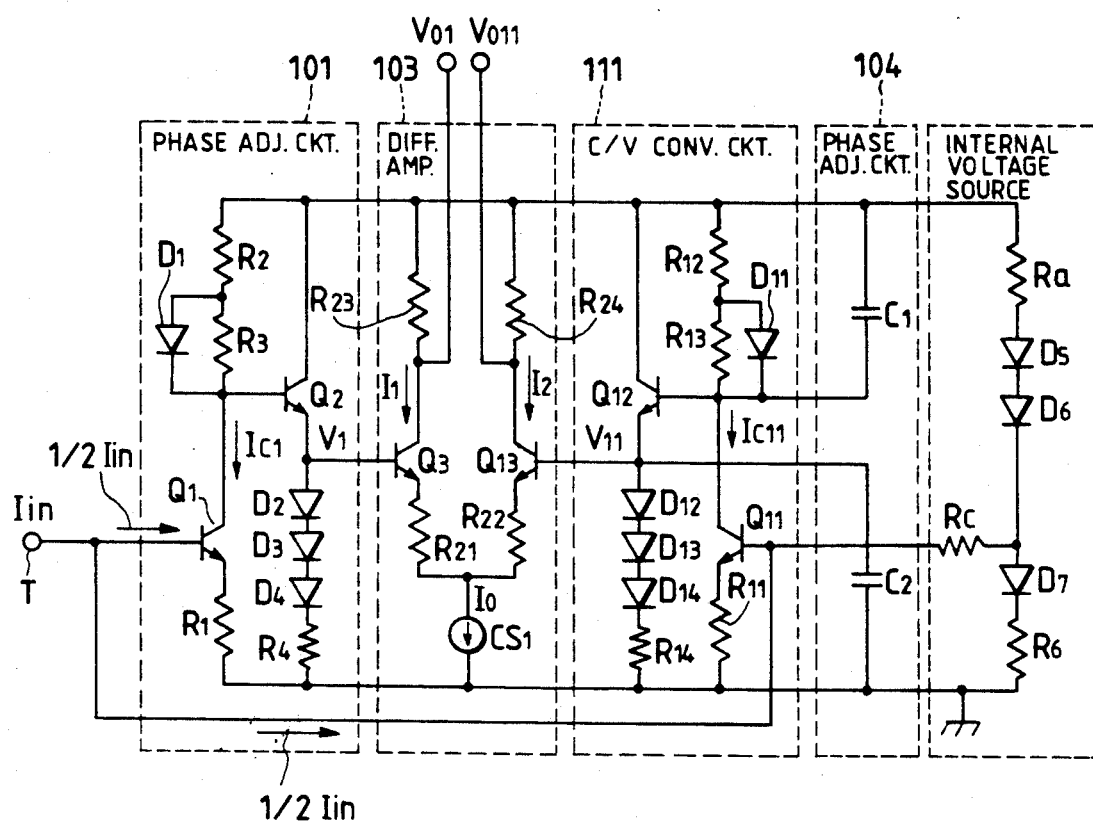
FIG. 14 is a circuit diagram of a sixth embodiment of the invention.

According to the embodiment of FIG. 14, higher speed preamplifier operation is achieved, as compared with the embodiment of FIG. 10, since the transistors $Q_1$ and $Q_{11}$ are constantly kept in the state of electric conduction, even when no input is applied to the circuit, so that the preamplifier may respond immediately when an input signal is fed to it. The resistor $R_c$ is provided in order to inhibit the flow of the input current toward the side of the internal voltage source. Moreover, the operation of the resistor $R_c$ is the same as that in the foregoing embodiment. Furthermore the resistors $R_1$, $R_{11}$, and $R_b$ need not be provided. Also, the internal voltage source is not limited to the case in which it is set up with the resistors mentioned above, and it goes without saying that any other circuitry that can set the transistors $Q_1$ and $Q_{11}$ in a constantly conductive state may be applied to the formation of the voltage source.

The embodiments of FIGS. 10, 12, 13, and 14 which have been described may be modified similarly to the embodiments of FIGS. 1, 2, 7, and 8. For example, the capacitors forming the phase adjusting circuit have the value of their capacitance fixed in the embodiments just described, so that the circuit may operate within a specified frequency range with respect to the input signals (i.e., in current and electric charge). However, the phase adjusting circuit may be constructed with capacitors installed externally for operation at a variable capacitance value, so that the circuit may operate suitably at an arbitrarily selected frequency.

Further, the semiconductor elements which comprise this preamplifier are not limited to the bipolar transistors and the MOS transistors mentioned above, but may well be an integrated circuit formed of a mixture of bipolar transistors and MOS transistors. Also, the preamplifier may be constructed with such other elements as bipolar transistors, CMOS transistors GaAs (gallium arsenide) elements, or Josephson devices.

Moreover, the embodiments just described have a phase adjusting circuit constructed with capacitors which are connected to the power source side and the GND side, but this construction is set up in order to deal properly with the case in which fluctuations occur in the power source voltage and the GND electric potential. In that case, it is possible to perform phase adjustment simply by providing the capacitors on either one of the two sides. Also, the component parts for the phase adjusting circuit are not limited to capacitors: rather, various circuits having a delay function may be used in constructing the circuit.

Further, the preamplifier described with reference to FIGS. 10, 12, 13, and 14 also can be used in an extensive range of applications in all electronic appliances which are required to detect electric current in excess of several $\mu A$ and to convert such currents into voltage, such as preamplifiers for scanners, electric charge detecting circuits for CCD area sensors, and preamplifiers for optical communication receivers.

As described in the foregoing, the preamplifier according to this aspect of the invention is constructed so as to convert the input current and electric charge into a voltage signal, to feed the converted signal to one of the input terminals of the differential amplifier, and also to feed the phase-adjusted voltage signal to the other input terminal of the differential amplifier. As a result the differential amplifier generates an amplified output signal on the basis of the voltage difference between the input terminals forming one pair, and also is constructed so as to reduce the change in the level of the voltage signals when the input signals have a high level.

The preamplifier constructed in this manner can be realized in a simple circuit construction, since it does not need any external gain control circuit or the like, and also can perform gain control suitable for the input signals.

Figure 15:
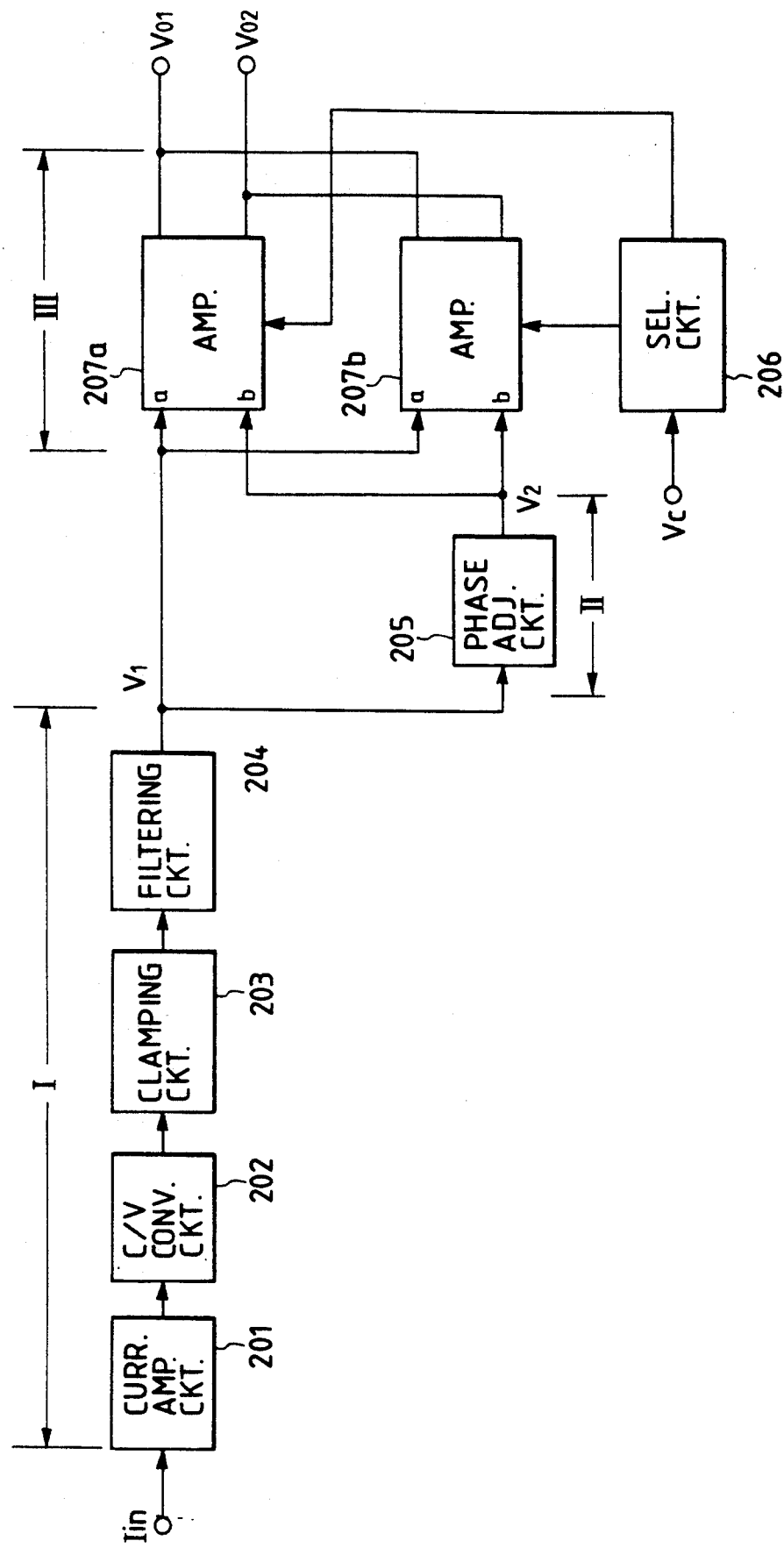
FIG. 15 is a circuit block diagram illustrating a seventh embodiment of the invention.

A seventh preferred embodiment of the invention now will be described with reference to FIGS. 15, 16, and 17. In FIG. 15, the circuit block I corresponds to a first signal processing system, the circuit block II corresponds to a second signal processing system, and the circuit block III corresponds to a plurality of amplifiers.

In the first signal processing system I, a current amplifying circuit 201 performs current amplification of the input current $I_{in}$ fed as the input signal. A current-voltage conversion circuit 202 performs current-voltage conversion with the voltage drops in the resistors $R_2$ and $R_3$ shown in FIG. 17. A level clamping circuit 203 clamps the voltage drop in the resistor $R_3$ when the input current $I_{in}$ changes into a large current. The capacitor $C_1$ forms the filtering circuit 204 together with the resistors $R_2$ and $R_3$, and performs operations such as eliminating noise. Thus, the output signal $V_1$ from the first signal processing system I, which is the voltage signal $V_1$ as already subjected to current-voltage conversion, is fed to the second signal processing system II and, at the same time, is fed in common to one input terminal a on a plurality of amplifiers 207a and 207b, which will be described later.

The second signal processing system is composed of a phase adjusting circuit 205, which performs phase adjustment to produce the second voltage signal $V_2$ at a desired phase difference in relation to the voltage signal $V_1$. Then, the output signal $V_2$ is fed to the other input terminal b on the plurality of amplifiers 207a and 207b.

The selecting circuit 206 is used to select the driving of the amplifier 207a and 207b. The amplifiers 207a and 207b are selected by setting the level of the control signal $V_c$ high or low. Also, the plurality of amplifiers 207a and 207b are formed to have a difference in gain, as shown in the gains $G_a$ and $G_b$ in FIG. 16, and either one of these amplifiers is selected in a manner suitable for the current rate of the input current $I_{in}$.

Figure 17:
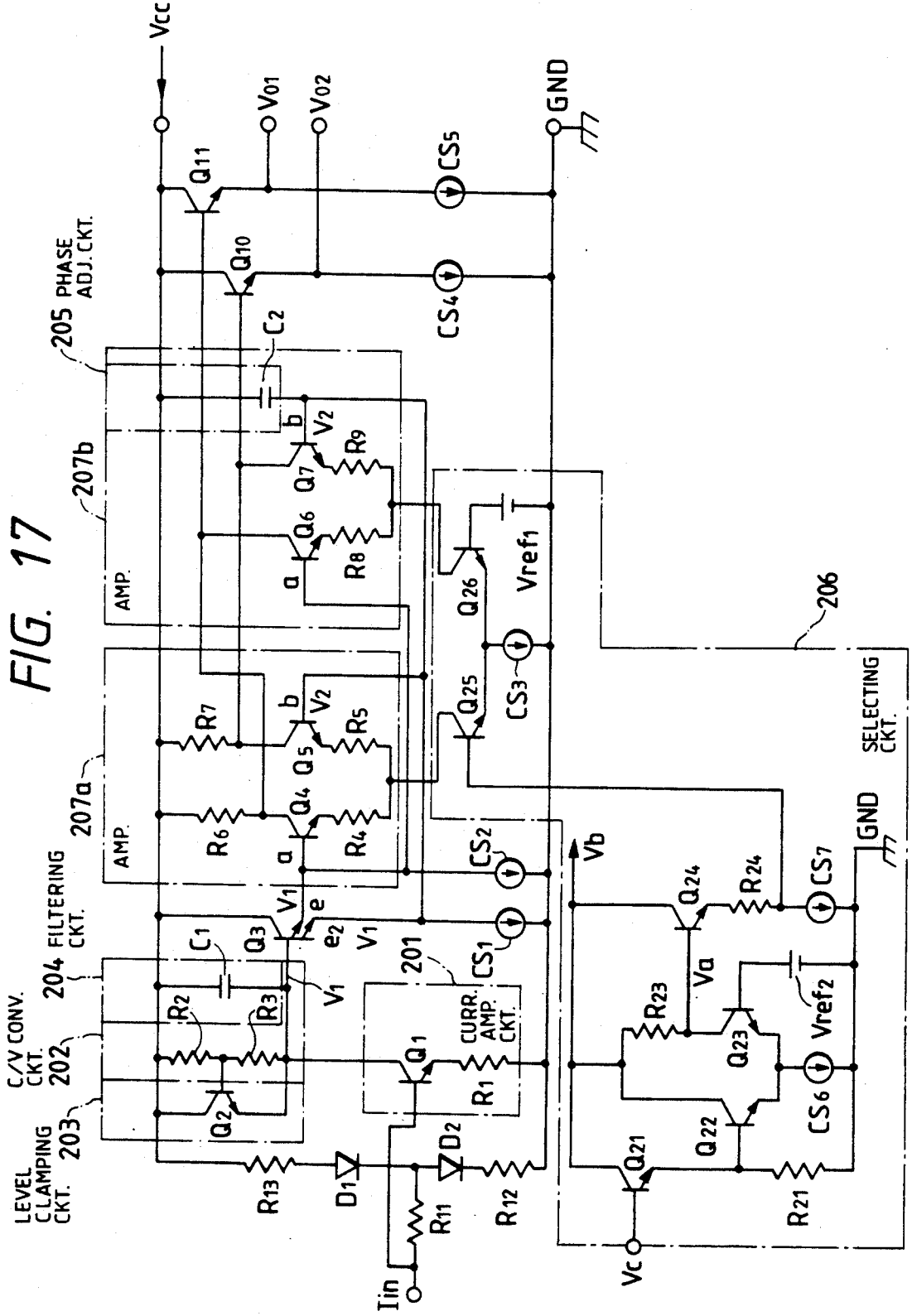
FIG. 17 is a circuit diagram showing a specific example of a circuit construction of the preamplifier of FIG. 15.

Next, with reference to FIG. 17, a description will be provided of the specific construction and the operation of the circuit of FIG. 15. The input circuit for the current amplifying circuit 201 is comprised of NPN transistor $Q_1$ and the resistor $R_1$, and performs current amplification of the input current $I_{in}$ by the ratio $h_{fe}$ (the current amplification factor). The current-voltage conversion circuit 202 is comprised of the resistors $R_2$ and $R_3$, and performs its current-voltage conversion by what people versed in the art call "IR drop". Moreover, the resistors $R_{11}$ through $R_{13}$ and the diodes $D_1$ and $D_2$, which are connected to the base of the transistor $Q_1$, set the bias voltage for the transistor $Q_1$.

The transistor $Q_2$ forms part of the level clamping circuit 203, and is turned ON when the voltage drop in the resistor $R_3$ rises above the voltage between the base and the emitter of the transistor $Q_2$ with an increase in the collector voltage of the transistor $Q_1$. Therefore, when the input current $I_{in}$ changes into a large current, the level clamping circuit 203 clamps the drop in the level of the base current of the transistor $Q_3$, which is the collector voltage of the transistor $Q_1$, at the prescribed voltage level. The capacitor $C_1$ forms part of the filtering circuit 204, which eliminates noise in the high frequency region, for example, by the frequency characteristics based on the time constant determined by the resistors $R_2$ and $R_3$.

The output voltage signal $V_1$ obtained from the signal processing systems described above is fed to the base of the transistor $Q_3$, which transmits the signal in divided parts. The transistor $Q_3$ is formed with double emitters, and the voltage signal $V_1$ transmitted to one emitter $e_1$ is fed in common to one input terminal a on the amplifiers 207a and 207b. Also, the output signal $V_1$ as transmitted to the other emitter $e_2$ is adjusted in phase by the phase adjusting circuit 205, which is composed of the capacitor $C_2$, and the phase-adjusted output voltage signal $V_2$ is fed to the input terminal b on each of the amplifiers 207a and 207b. Accordingly, the pair of input terminals a and b on the amplifiers 207a and 207b will be fed with the output voltage $V_1$ and the output voltage $V_2$, which has a phase difference, based on the capacitance of the capacitor $C_2$, in relation to the output voltage $V_1$.

The amplifier 207b is composed of the transistors $Q_6$ and $Q_7$ connected in the form of a differential pair, the emitter resistors $R_8$ and $R_9$ for setting the gain, and the resistors $R_6$ and $R_7$ as the common load. In addition, this amplifier 207b is constructed so that its driving current is controlled to be turned on and off by the selecting circuit 206. Moreover, the gains $G_a$ and $G_b$ of the amplifiers 207a and 207b have the relationship $G_a > G_b$, as described with reference to FIG. 16, by the selection of the resistors $R_4$, $R_5$, $R_6$, and $R_7$ mentioned above.

The transistors $Q_{10}$ and $Q_{11}$ and the constant current circuits $CS_4$ and $CS_5$ form an output circuit, from which the output signals $V_{01}$ and $V_{02}$ are obtained. The selecting circuit 206 controls selective driving of either one of the amplifiers 207a and 207b in correspondence to the setting of the level with the control signal $V_c$. That is, the transistors $Q_{21}$ and the resistor $R_{21}$ form an input circuit, which transmits at a low impedance the control signal $V_c$, which changes in two stages, to the base of the transistor $Q_{22}$. The transistors $Q_{22}$ and $Q_{23}$ compare the voltage between the reference voltage and the control signal $V_c$, and, if $V_c > V_{ref2}$, the comparison output $V_a$ which is obtained in the form of a voltage drop in the resistor $R_{23}$, attains a high level H, i.e, a voltage level close to that of the power source $V_{cc}$.

On the other hand, if $V_c < V_{ref2}$, the voltage drop in the resistor $R_{23}$ becomes high, and the comparison output $V_a$ falls to a low level L. The transistor $Q_{24}$, the resistor $R_{24}$, and the constant current circuit $CS_7$ form the output circuit, which feeds the selecting signal $V_b$ based on the above-mentioned comparison output $V_a$ to the base of the transistor $Q_{25}$.

The transistors $Q_{25}$ and $Q_{26}$, connected to form a differential pair, work as a switching circuit for selecting the driving of the amplifiers 207a and 207b. That is, the circuit compares the selecting signal $V_b$ and the reference voltage $V_{ref1}$. The transistor $Q_{25}$ is turned ON when $V_b > V_{ref1}$, while the transistor $Q_{26}$ is turned ON when $V_b < V_{ref1}$. Consequently, when the control signal is at a high level, the comparison output Va and the selecting signal $V_b$ also attain a high level H, so that the transistor $Q_{25}$ is turned ON. As the result of this operation, a current path is formed for the amplifier 207a, which means that the amplifier 207a has been selected in a manner to enable it to perform its operation. In contrast, when the control signal $V_c$ is at a low level, the comparison output and the selecting signal $V_b$ also assume a low level L, and the transistor $Q_{26}$ is turned ON. As a result, a current path is formed for the amplifier 207b, which means that the amplifier 207b has been selected in a manner to enable it to perform its operation.

In a preamplifier constructed in this manner, the control signal $V_c$ is switched over to the high level to drive the transistor $Q_{25}$ at that level, as it is desired to perform amplification at a high amplifying factor on a weak and small current fed as the input current $I_{in}$. As a result, the selecting circuit 206 will select the amplifier 207a with a higher gain.

The input current $I_{in}$ is fed to the base of the transistor $Q_1$ in overlapping relation with the prescribed bias voltage, and is current amplified by the ratio $h_{fe}$. Next, the resistors $R_2$ and $R_3$ convert the current into the voltage signal $V_1$, and then the capacitor $C_1$ eliminates the high frequency noises from the voltage signal $V_1$. Thereafter, the voltage signal $V_1$ is fed to the input terminal a of the selected amplifier 207a via the emitter $e_1$ of the transistor $Q_1$. Also, the voltage signal $V_1$ which is transmitted via the emitter $e_2$ is adjusted in phase by the capacitor $C_2$, and the voltage signal $V_2$ is fed to the other input terminal b of the amplifier 207a. Since a voltage difference arises in correspondence to the difference in phase between the voltage signal $V_1$ and the voltage signal $V_2$, the collector current of the transistors $Q_4$ and $Q_5$ will change on the basis of this voltage difference. Then, with voltage drops in the load resistors $R_6$ and $R_7$ in correspondence to the change in the current, the output signals $V_{01}$ and $V_{02}$, which correspond to the voltage difference, are obtained.

Moreover, when the input current $I_{in}$ changes to a high current while the above-mentioned amplifying operations are being performed, the transistor $Q_2$ begins operation and performs the clamping operation as mentioned above. Consequently, a large change in the level of the voltage signal $V_1$ is restricted, so that it is possible to stabilize the output signals $V_{01}$ and $V_{02}$. Moreover, when the amplifier 207a is selected, the current path for the other amplifier 207b is cut off. Accordingly, the amplifier 207b is rendered inoperative, and there will be no power consumption, thus saving energy.

When the input current $I_{in}$ is large, the control signal is adjusted to the low level, and the transistor $Q_{26}$ is turned ON in place of the transistor $Q_{25}$. As a result, the current path for the amplifier 207b is formed, while the current path for the amplifier 207a is cut off. In this case, too, the same circuit operations as those mentioned above are performed in the circuits, i.e. from the current amplifying circuit 201 to the filtering circuit 205, and the voltage signal $V_1$, which is fed to the input terminal a of the amplifier 207b. and the voltage signal $V_2$, which is fed to the input terminal b of the amplifier 207b, will have a voltage difference based on the difference in phase between them. The amplifier 207b performs its amplifying operations based on the difference in voltage between the voltage signal $V_1$ and the voltage signal $V_2$, and yet, as it is set at a lower gain as compared with the amplifier 207a, this amplifier 207b generates the output signals $V_{01}$ and $V_{02}$ as amplified at a low level in spite of the fact that the input current $I_{in}$ is large.

Thus, the preamplifier described in this embodiment is capable of controlling the gain in an extremely simple manner with the control signal $V_c$.

Next, an eighth embodiment of the invention will be described with reference to FIGS. 18 and 19. The difference between this embodiment and the preceding embodiment consists in the construction of the preamplifier with four amplifiers with varying gains, and in a construction which permits the selection of any of the amplifiers arbitrarily using two control signals.

Figure 18:
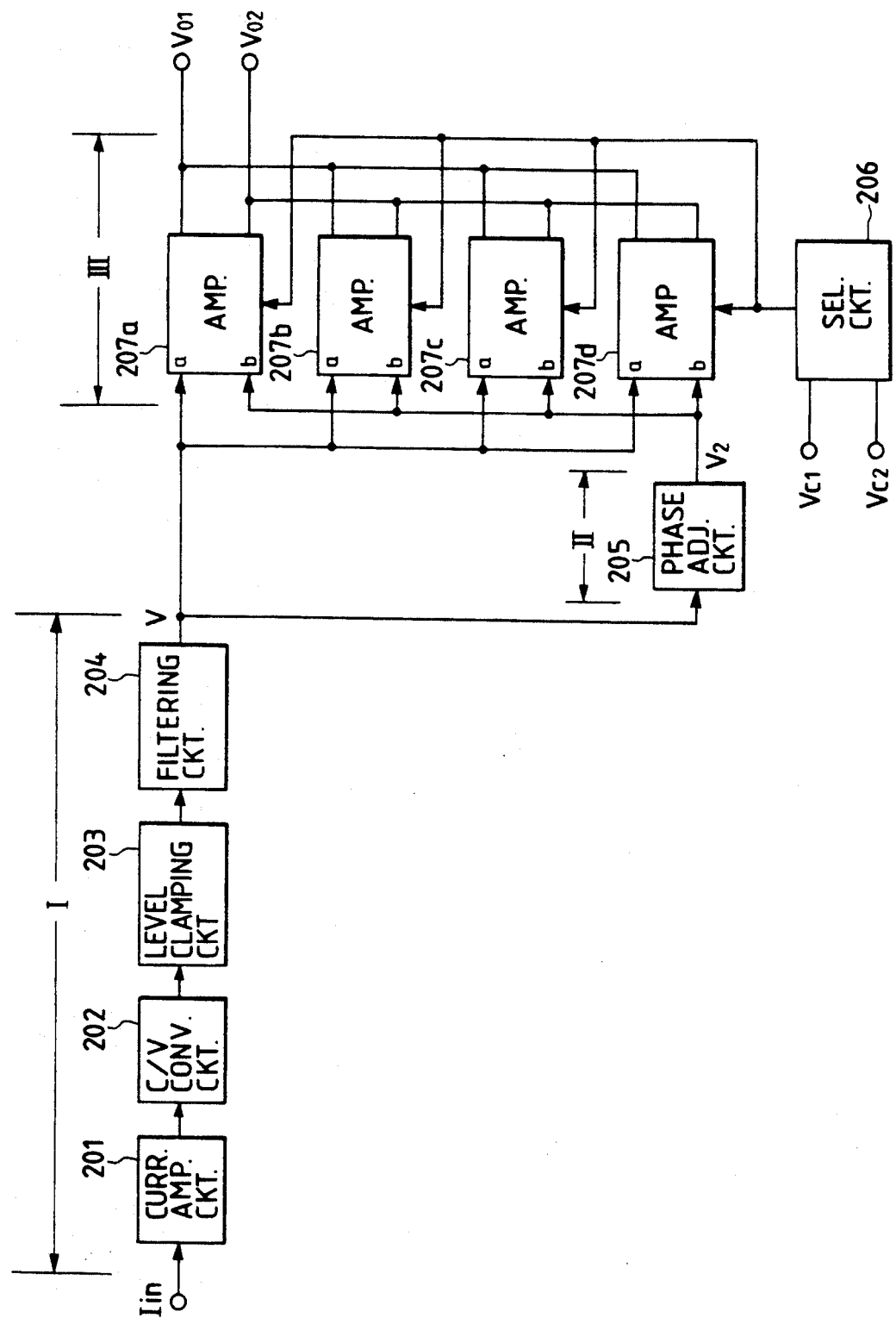
FIG. 18 is a circuit block diagram showing an eighth embodiment of the invention.

As illustrated in FIG. 18, the construction of circuits from the current amplifying circuit 201 to the filtering circuit 204 and further to the phase adjusting circuit 205 is the same as that of the preceding embodiment. As the individual amplifying circuits 207a through 207d are formed using the same circuit construction, as shown in FIG. 19, the resistor and transistor reference numerals used in the preceding embodiment are applied correspondingly with respect to amplifiers 207a and 207b, while Q and Re are used for transistors and resistors, respectively, in amplifiers 207c and 207d.

Figure 16:
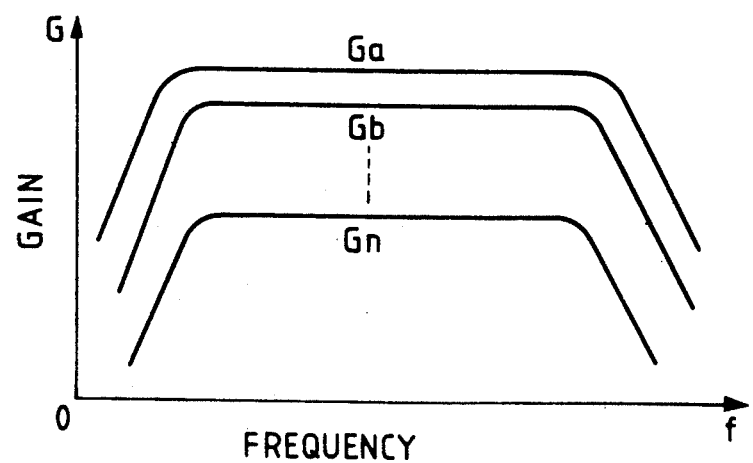
FIG. 16 is a gain characteristics chart for the preamplifier of FIG. 15.

Moreover, the individual amplifiers 207a and 207b have different gains as illustrated in FIG. 16, and the difference in the gains is determined by the ratio between the resistors $R_7$ and $R_8$, which work as a common load on the four amplifiers 207a through 207d, and the emitter resistor Re. Thus, the circuitry is formed in such a way that the output signals $V_{01}$ and $V_{02}$ can be obtained from the resistors $R_7$ and $R_8$, which thus work as a common load on the amplifiers, whichever one of the four amplifiers 207a through 207d may be selected. Moreover, CS placed in each circuit block indicates a constant voltage circuit, and $V_{ref}$ represents the reference voltage for the voltage comparison.

Figure 19:
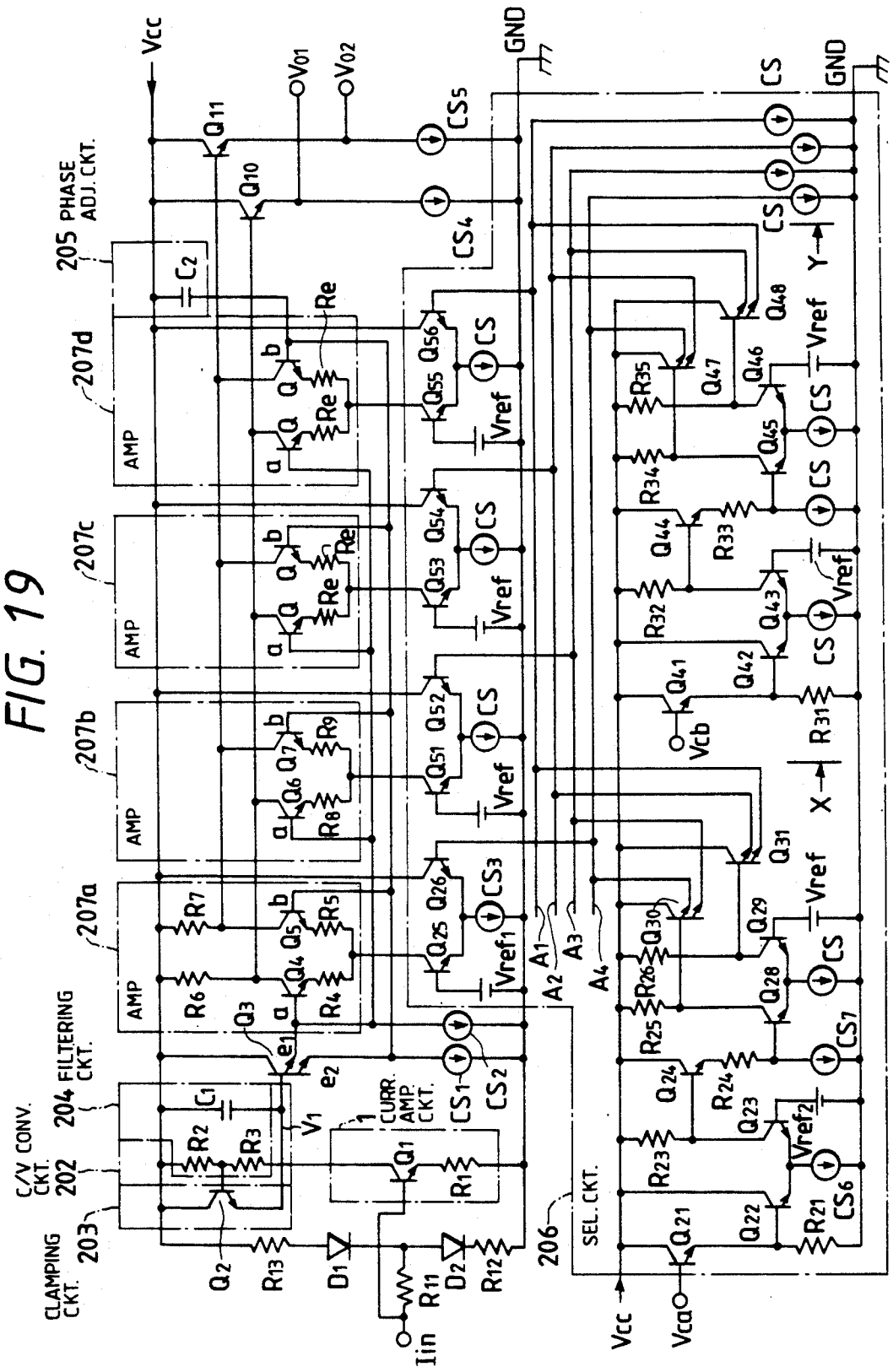
FIG. 19 is a circuit diagram illustrating a specific example of the preamplifier of FIG. 18.

In FIG. 19, the selecting circuit 206 is formed with a first control block X, which operates in response to the control signal $V_{ca}$, and a second control block Y, which operates in response to the control signal $V_{cb}$, the blocks X and Y having the same construction. Thus, this selecting circuit is capable of driving selectively any one of the amplifiers 207a through 207d according to the levels of the control signals $V_{ca}$ and $V_{cb}$. Subsequently, the selection of the amplifiers 207a through 207d with the control signals $V_{ca}$ and $V_{cb}$ will be described. First, a description will be provided of circuit operation when the amplifier 207a is to be selected.

In this case, the control signals $V_{ca}$ and $V_{cb}$ both are set at the high level. When the control signal $V_{ca}$ is at the high level, the transistors $Q_{21}$ through $Q_{24}$, which form part of the control block X, operate as described with reference to FIG. 17. Then, the transistor $Q_{28}$, which forms part of the comparator, is turned ON, and the transistor $Q_{29}$ is turned OFF. The base current of the transistor $Q_{30}$ changes to a low level as a result of the voltage drop in the resistor $R_{25}$. The output transistor $Q_{30}$, which is formed with double emitters, is turned OFF, and the voltage level in the lines $A_2$ and $A_3$ is set at the low level L. Moreover, no voltage drop occurs in the load resistor $R_{26}$, and the output transistor $Q_{31}$, which is formed with double emitters, operates in its ON state. As the result of this operation, the voltage on the lines $A_1$ and $A_2$ attains the high level H.

On the other hand, when the control signal $V_{cb}$ is at the high level H, the transistors $Q_{41}$ through $Q_{46}$ operate in the same way as the transistors $Q_{21}$ through $Q_{24}$, $Q_{28}$, and $Q_{29}$, and, by the effect of the voltage drop in the resistor $R_{34}$, the base current of the transistor $Q_{47}$ is set at the low level. Also, as no voltage drop occurs in the resistor $R_{35}$, the base current of the output transistor $Q_{48}$ attains the high level. Consequently, the transistor $Q_{47}$ is turned off, and the voltage in the lines $A_2$ and $A_4$ is set at the low level. Yet, as the transistor $Q_{48}$ is turned ON, the voltage on the lines $A_1$ and $A_3$ is set at the high level H.

In this regard, as viewed with respect to the lines $A_1$ through $A_4$, the voltage level in the line $A_4$, to which outputs at a low level are fed from the transistors $Q_{30}$ and $Q_{47}$, is set at the low level L. However, the voltage level in the lines $A_1$ through $A_3$ is set at the high level H by the output from either one or both of the transistors $Q_{31}$ and $Q_{48}$.

As the result of these operations, the transistor $Q_{26}$, the base of which is connected to the line $A_4$, is turned OFF, and the transistor $Q_{25}$ operates in its ON state, thereby forming the current path for the amplifier 207b. Consequently, the amplifier 207a is selected, and is put into a state which enables it to perform the same amplifying operations as those mentioned above. Moreover, the transistor $Q_{52}$, the base of which is connected to the line $A_3$, operates in its ON state, and the transistor $Q_{51}$ is turned OFF. The current path for the amplifier 207b is not formed, and therefore the amplifier 207b becomes inoperative and does not perform any amplifying operation.

Subsequently, the selecting operations are continued in the same manner. The transistor $Q_{54}$, the base of which is connected to the line $A_2$, operates in its ON state, and the transistor $Q_{53}$ is turned OFF. The current path for the amplifier 207c is not formed, and the amplifier 207c therefore is put into its inoperative state and does not perform any amplifying operation. Further, the transistor $Q_{56}$, which has its base connected to the line $A_1$, operates in its ON state, and the transistor $Q_{55}$ is turned OFF. The current path for the amplifier 207d is not formed, and the amplifier 207d, thereby being put into its inoperative state, does not perform any amplifying operation.

Next, circuit operation when the amplifier 207b is to be selected will be described. In this case, the control signal levels are set so that $V_{ca} > V_{cb}$. Since the control signal $V_{ca}$ is at the high level, the transistors $Q_{21}$ through $Q_{24}$ and $Q_{28}$ through $Q_{31}$ which form the control block X operate in the same manner as described above, and the lines $A_1$ and $A_2$ are set at the high level while the lines $A_3$ and $A_4$ are kept at the low level.

On the other hand, with the control signal $V_{cb}$ being set at the low level, the transistor $Q_{43}$, which forms part of the control block Y, operates in its ON state, and, as the result of a voltage drop in the resistor $R_{32}$, the base voltage of the transistor $Q_{44}$ falls to the low level. Consequently the transistor $Q_{46}$ will operate in its ON state. As the result of these operations, no voltage drop occurs in the resistor $R_{34}$, so that the transistor $Q_{47}$ operates in its ON state, and, by the effect of a voltage drop in the resistor $R_{35}$, the transistor $Q_{48}$ is turned OFF.

The lines $A_1$ and $A_2$ are set at the high level by the transistor $Q_{31}$, and the line $A_4$ also is set at the high level by the transistor $Q_{47}$, but the line $A_3$ is set at the low level by the transistor $Q_{30}$ in the control block X and by the transistor $Q_{48}$ in the control block Y. Therefore, in this case, only the line $A_3$ is set at the low level, and the transistor $Q_{52}$ is turned OFF. The transistor $Q_{51}$ is turned ON, by which the current path for the amplifier 207b is formed, and the amplifier 207b thus is enabled to perform its amplifying operation. Also, the transistors $Q_{26}$, $Q_{54}$, and $Q_{56}$, which are connected to the lines $A_4$, $A_2$, and $A_1$, are respectively turned ON and the amplifiers 207a, 207c, and 207d are rendered inoperative.

Next, circuit operation will be described in the case where the amplifier 207c is to be selected. In this case, the control signals are set so that $V_{ca} < V_{cb}$.

With the control signal $V_{ca}$ set at the low level, the transistor $Q_{23}$ which forms part of the control block X is turned ON, and the transistor $Q_{30}$ is turned OFF, while the transistor $Q_{31}$ is turned ON and the transistor $Q_{29}$ is turned OFF. Consequently, the lines $A_1$ and $A_2$ are set at the low level, but the lines $A_3$ and $A_4$ are held at the high level.

On the other hand, the control block Y operates in the manner described above, since the control signal $V_{cb}$ is set at the high level, and the transistor $Q_{47}$ is kept OFF while the transistor $Q_{48}$ is turned ON. Accordingly, all of the lines $A_1$, $A_3$, and $A_4$ are set at the high level, although the line $A_2$ is set at the low level L by the transistors $Q_{31}$ and $Q_{47}$. As a result, the transistor $Q_{54}$, the base of which is connected to the line $A_2$, is turned OFF and, at the same time, the transistor $Q_{53}$ is turned ON. The current path for the amplifier 207c thus is formed, and so the amplifier 207c is rendered operative. Also, the transistors $Q_{26}$, $Q_{52}$, and $Q_{56}$ all are turned ON, so that no current path for any of the amplifier 207a, 207b, and 207d will be formed, and these amplifiers thus are rendered inoperative.

Next, operation for selection of the amplifier 207d will be described. In this case, both of the control signals $V_{ca}$ and $V_{cb}$ are set at the low levels. In this case, the transistors $Q_{21}$ through $Q_{24}$ and $Q_{28}$ through $Q_{31}$ which form the control block X operate in the same manner as described above, and the lines $A_3$ and $A_4$ are set at the high level. In the control block Y, in the meantime, the transistors $Q_{41}$ through $Q_{48}$ operate in the same manner as described above, and the lines $A_1$ and $A_3$ are set at the low level, while the lines $A_2$ and $A_4$ are set at the high level. As a result, only the line $A_1$ is held at the low level, so that the transistor $Q_{56}$ is turned OFF. Consequently, the transistor $Q_{55}$ is turned ON, and a current path is formed for the amplifier 207d, which thereby is rendered operative.

In contrast, as the lines $A_2$ through $A_4$ are set at the high level, the transistors $Q_{26}$, $Q_{52}$, and $Q_{54}$ are turned ON, and, by the circuit operations mentioned above, all the individual amplifiers 207a through 207c are rendered inoperative.

Next, a description will be provided of each of the amplifiers 207a through 207d. Whichever of these amplifiers may be selected in the course of circuit operation, the voltage signal $V_1$ is fed to the input terminal a, while a phase-adjusted version of the voltage signal $V_2$ is fed to the input terminal b. Then, the selected amplifier performs its amplification operation with the voltage difference corresponding to the phase difference between the two voltage signals, and thereby generates the output signals $V_{O1}$ and $V_{O2}$ on the basis of the voltage drops in the resistors $R_6$ and $R_7$, which form a common load on the amplifier.

Also, this embodiment of the invention makes it possible to perform optimum amplification by selecting the amplifier with the desired gain in a manner suitable for the input current $I_{in}$. Moreover, it is possible to reduce power consumption by rendering the other amplifiers inoperative while any one of the amplifiers is kept in operation.

Furthermore, the amplifiers may be modified to set various gains for their operation with the four current source CS for the amplifiers 207a through 207d set at different current values.

Figure 20:
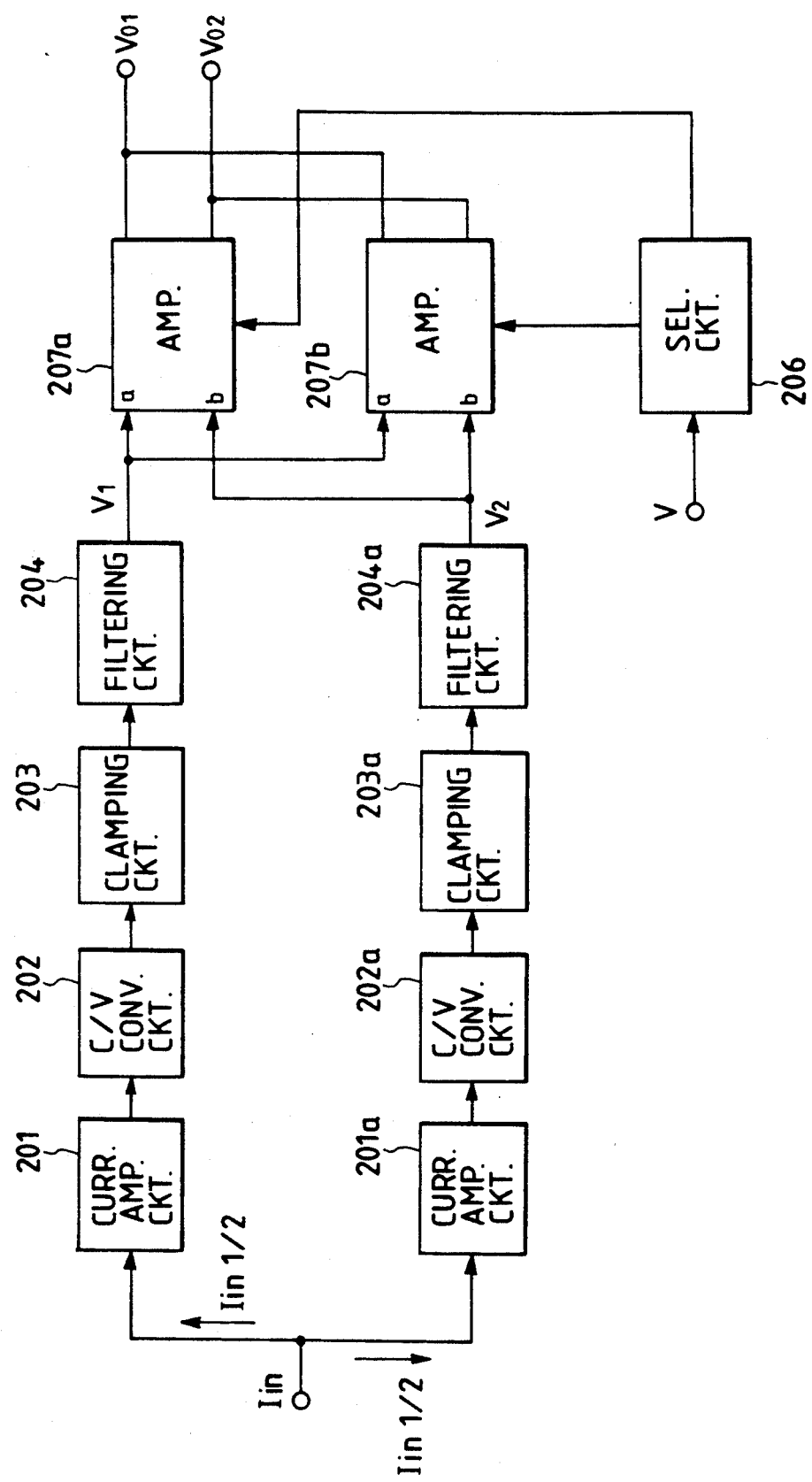
FIG. 20 is a circuit block diagram showing a ninth embodiment of the invention.
Figure 21:
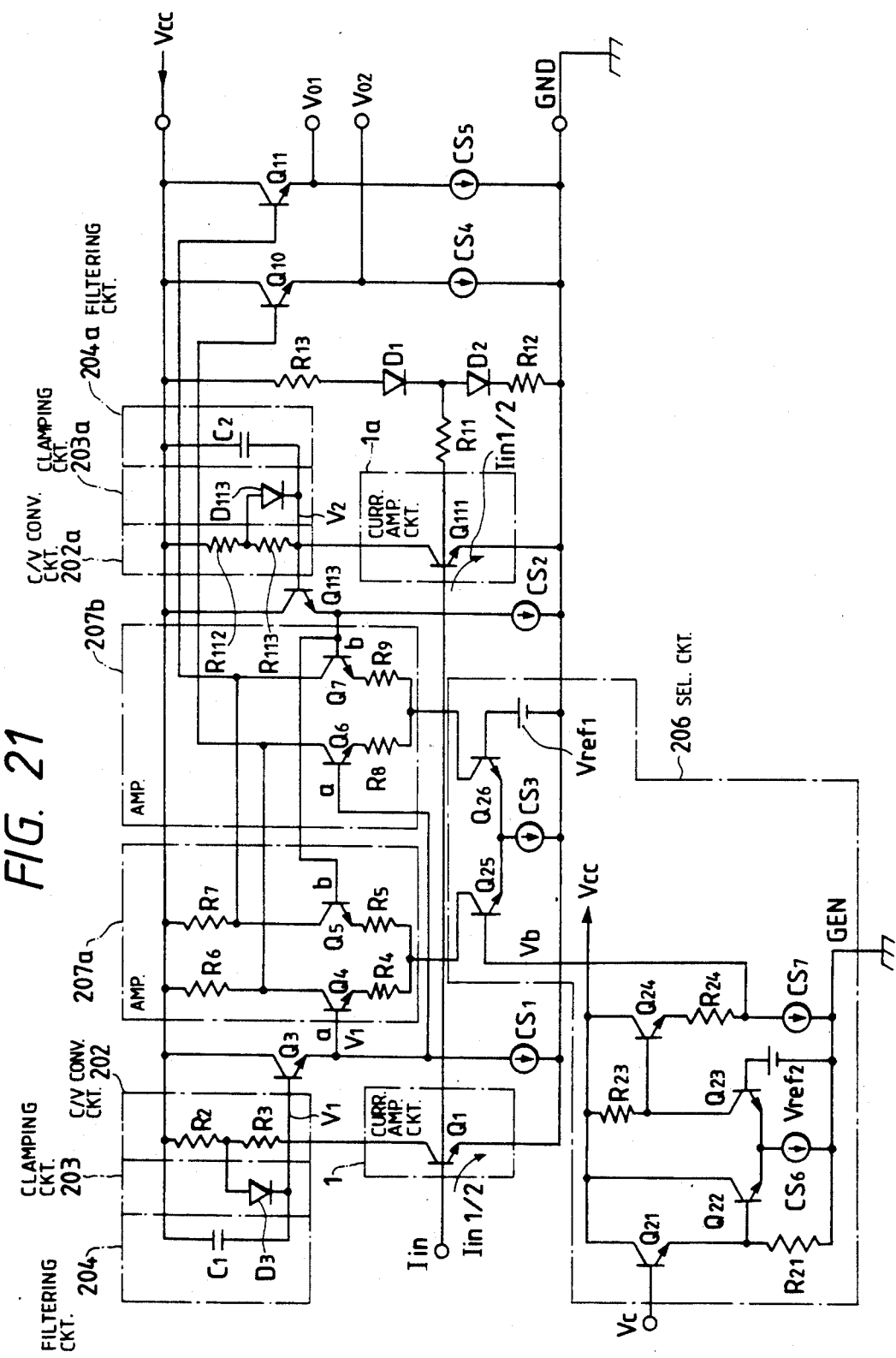
FIG. 21 is a circuit diagram illustrating a specific example of the preamplifier of FIG. 20.

Next, a description will be provided of a ninth embodiment of the invention with reference to FIGS. 20 and 21. The characteristic feature of this embodiment consists in the provision of two channels of signal processing systems, each of which is comprised of circuits from the current amplifying circuit 201 to the filtering circuit 204 as mentioned above, constructed so as to feed the output signals from each of the signal processing systems to a plurality of amplifiers.

The input current $I_{in}$ is divided in half, i.e, two currents of $I_{in}/2$ each, and the divided input current is fed to the current amplifying circuits 201 and 201a. This divided current is formed by constructing the current amplifying circuits 201 and 201a in the same way, and with the transistors $Q_1$ and $Q_{111}$ having the same characteristics. Moreover, with a bias circuit composed of resistors $R_{11}$ through $R_{13}$ and also diodes $D_1$ and $D_2$, a common bias voltage is fed to the transistors $Q_1$ and $Q_{111}$.

The resistors $R_2$ and $R_3$ and the resistors $R_{112}$ and $R_{113}$ perform current-voltage conversion in the same manner as described above, and the diodes $D_1$ and $D_{113}$ perform the clamping operations in the same manner as the transistor $Q_2$ does, as described in the embodiment of FIG. 17. The capacitors $C_1$ and $C_2$ form a filtering circuit together with the resistors $R_2$ and $R_3$ and the resistors $R_{112}$ and $R_{113}$, and, in order to set up a phase difference between the voltage signals $V_1$ and $V_2$, the capacitance of these capacitors is selected so that $C_1 < C_2$. Therefore, the phase difference between the voltage signals $V_1$ and $V_2$ will correspond to the capacitance difference between $C_1$ and $C_2$.

The transistor $Q_3$ feeds the voltage signal $V_1$ to the input terminal a on each of the amplifiers 207a and 207b, and the transistor $Q_{113}$ feeds the voltage signal $V_2$ to the input terminal b on each of the amplifiers 207a and 207b.

The selecting circuit 206 has the same construction as that of the embodiment of FIG. 17 and, when the control signal $V_c$ is at the high level, the transistor $Q_{25}$ is turned ON, and the amplifier 207a is selected. However, when the control signal $V_c$ is set at the low level, the transistor $Q_{26}$ is turned ON, and the amplifier 207b is selected. Then, whichever of the amplifiers 207a and 207b may be selected, the output signals $V_{O1}$ and $V_{O2}$ are obtained by the effect of the voltage drops in the resistors $R_6$ and $R_7$.

Figure 22:
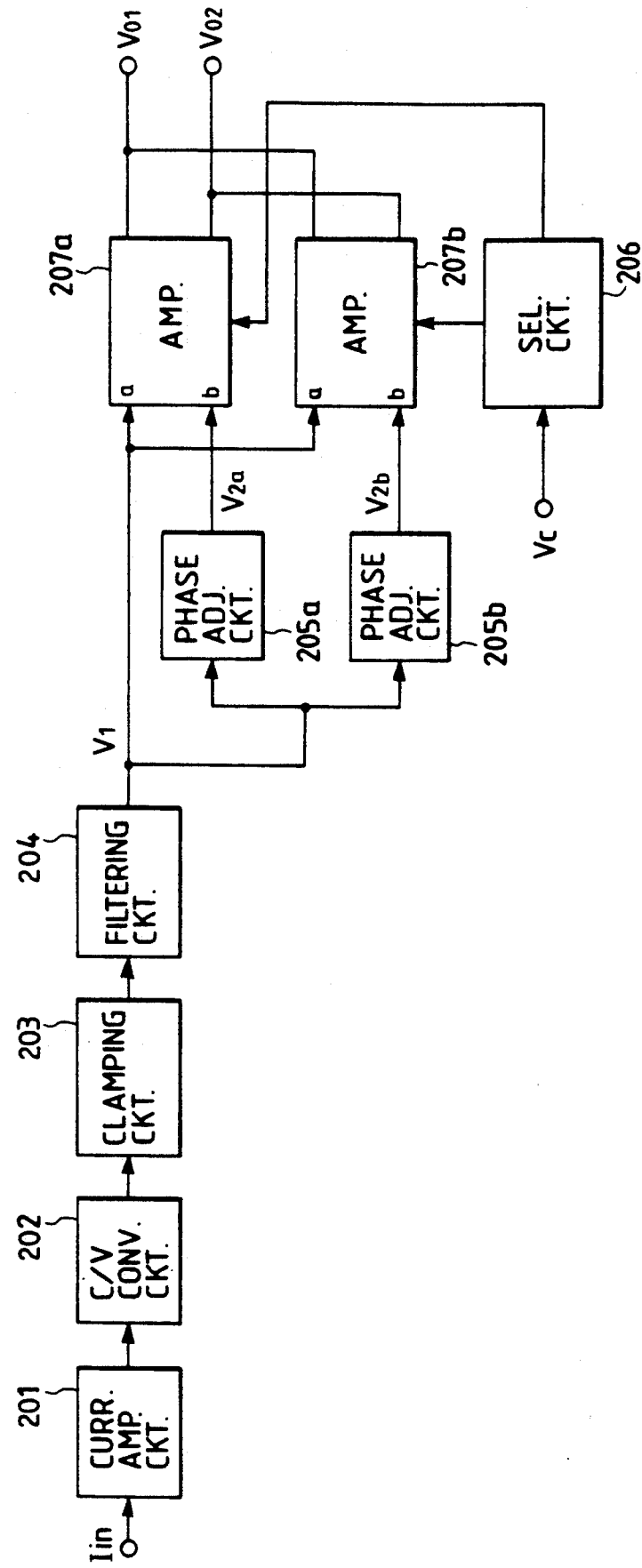
FIG. 22 is a circuit block diagram illustrating a tenth embodiment of the invention.
Figure 23:
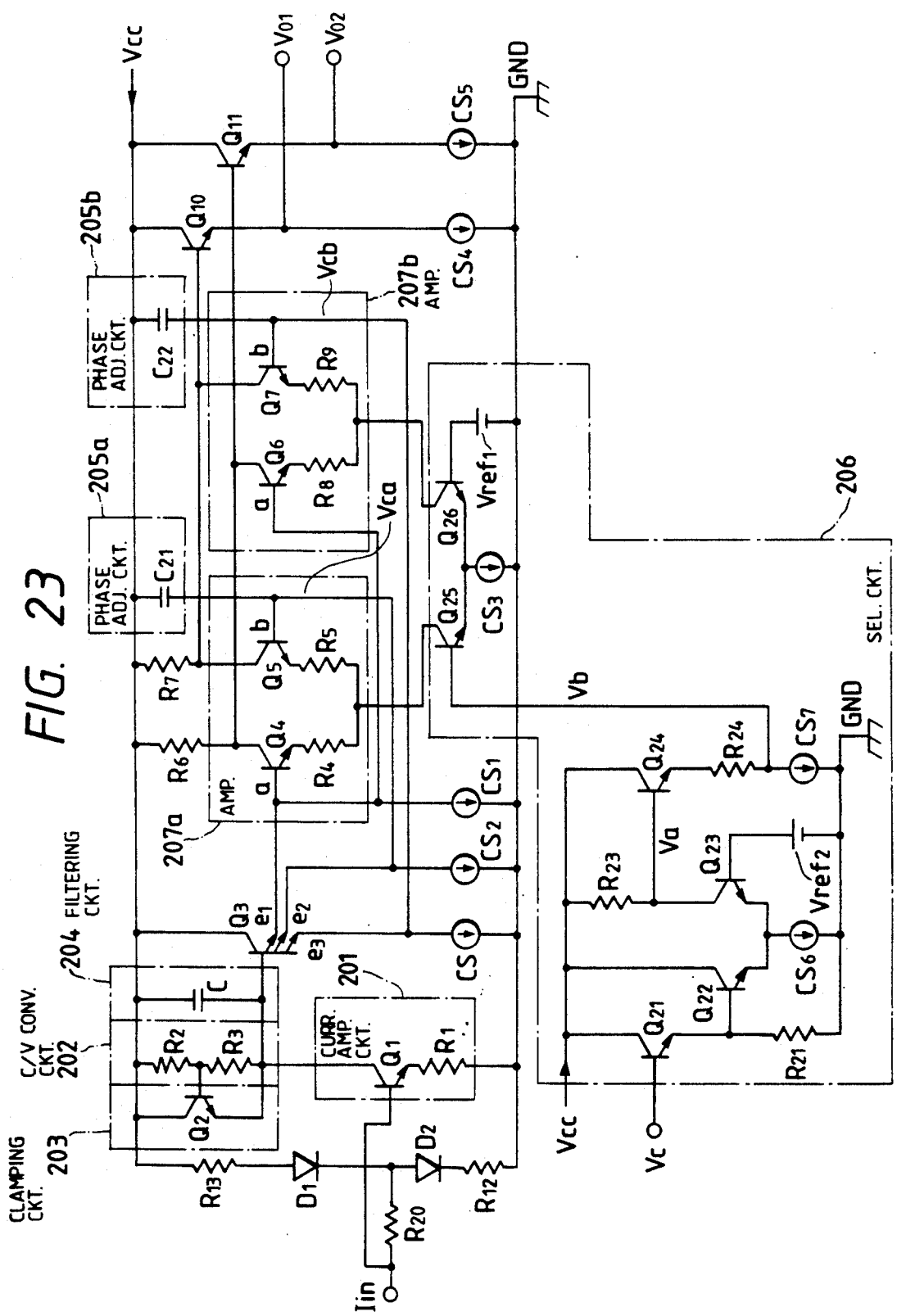
FIG. 23 is a circuit diagram illustrating a specific example of the preamplifier of FIG. 22.

Next a tenth embodiment of the invention will be described with reference to FIGS. 22 and 23. The characteristic feature of this embodiment resides in the provision of a second phase adjusting circuit, so that voltage signals having different phases are fed separately to the individual differential amplifiers.

The circuits from the current amplifying circuit 201 to the filtering circuit 204 in this embodiment are identical in construction to the corresponding circuits in the embodiment of FIG. 17. The voltage signal $V_1$ obtained from the filtering circuit 204 is fed from the first emitter $e_1$ of the transistor $Q_3$ to the bases of the transistors $Q_4$ and $Q_6$, as shown specifically in FIG. 23, and also is fed from the emitter $e_2$ to the capacitor $C_{21}$, which forms the first phase adjusting circuit 205a, and further from the emitter $e_3$ to the capacitor $C_{22}$, which forms the second phase adjusting circuit 205b. Then, with the capacitance of the capacitors $C_{21}$ and $C_{22}$ being such that $C_{21} > C_{22}$, the voltage signals $V_{2a}$ and $V_{2b}$, which have a phase difference with respect to the voltage signal $V_1$ and at the same time have a phase difference with respect to each other, will be fed separately to the input terminal b on each of the amplifiers 207a and 207b, and specifically, to the bases of the transistors $Q_5$ and $Q_7$.

Accordingly, if the control signal $V_c$ is set at the high level and the amplifier 207a is selected, output signals corresponding to the phase difference between the voltage signal $V_1$ and the voltage signal $V_{2a}$ are obtained. Also, if control signal $V_c$ is set at the low level and the amplifier 207b is selected, the output signals $V_{01}$ and $V_{02}$ corresponding to the phase difference between the voltage signals $V_1$ and $V_{2b}$ are obtained. In this embodiment, there is a phase difference between the voltage signals $V_{2a}$ and $V_{2b}$. The preamplifier can set not only a difference in level, corresponding to the difference in gain, but also a difference in phase between the output voltages $V_{01}$ and $V_{02}$ whether the amplifier 207a or the amplifier 207b is selected.

Figure 24:
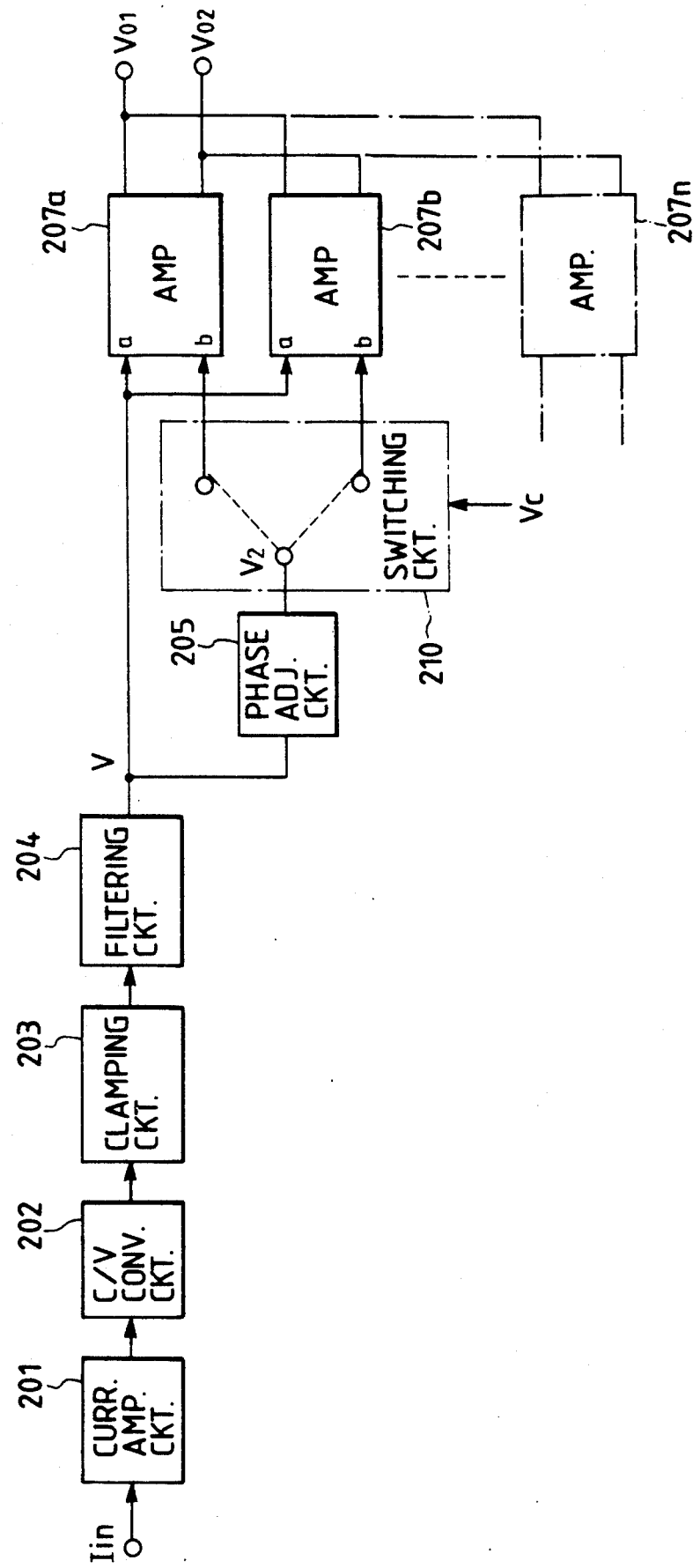
FIG. 24, FIG. 25, and FIG. 26 are circuit block diagrams illustrating an eleventh embodiment of the preamplifier according to the invention.

Next, an eleventh embodiment of the invention will be described with reference to FIGS. 24 through 26. Many of the preceding embodiments select one of the plurality of amplifiers by turning the driving current on and off. Instead of this selecting process, the preamplifier may be constructed to perform this selection of the amplifier by control over signal transmission. For example, as shown in FIG. 24, a switching circuit 210 for controlling the transmission of the voltage signal $V_2$ can be provided between the phase adjusting circuit 205 and a plurality of amplifiers 207a and 207b. In this case, it is possible to feed the voltage signal $V_2$ selectively to the amplifier 207a or the amplifier 207b by controlling the switching circuit 210 for its changeover, in which case the output signals $V_{01}$ and $V_{02}$ can be obtained from the amplifier to which the voltage signal $V_{02}$ is fed.

Figure 25:
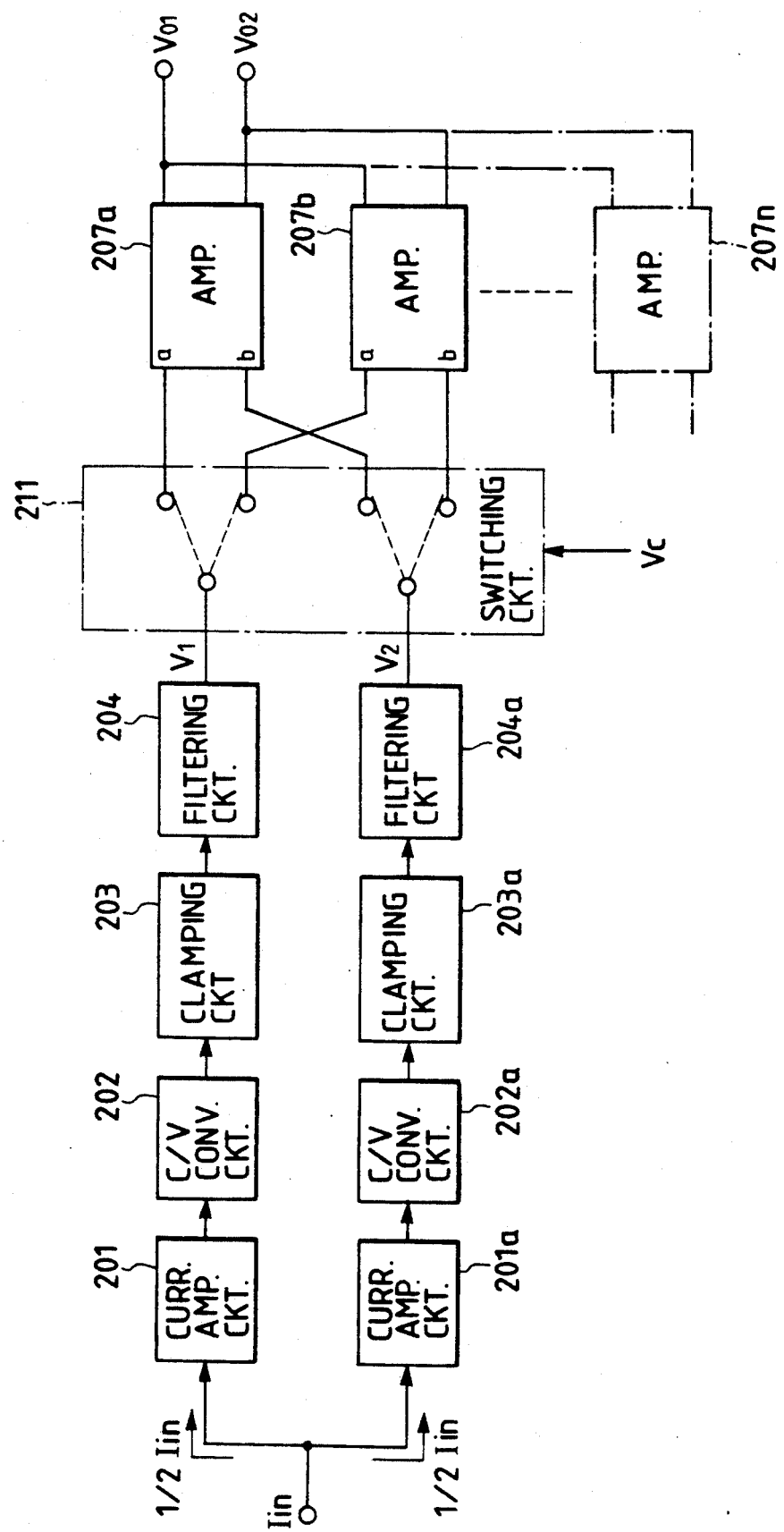

Further, as shown in FIG. 25, a switching circuit 211 for controlling the transmission of the voltage signals $V_1$ and $V_2$ is provided between the filtering circuits 204 and 204a and the plurality of amplifiers 207a and 207b. In this case, the output signals $V_{01}$ and $V_{02}$ are obtained from the amplifier to which the voltage signals $V_1$ and $V_2$ are fed.

Figure 26:
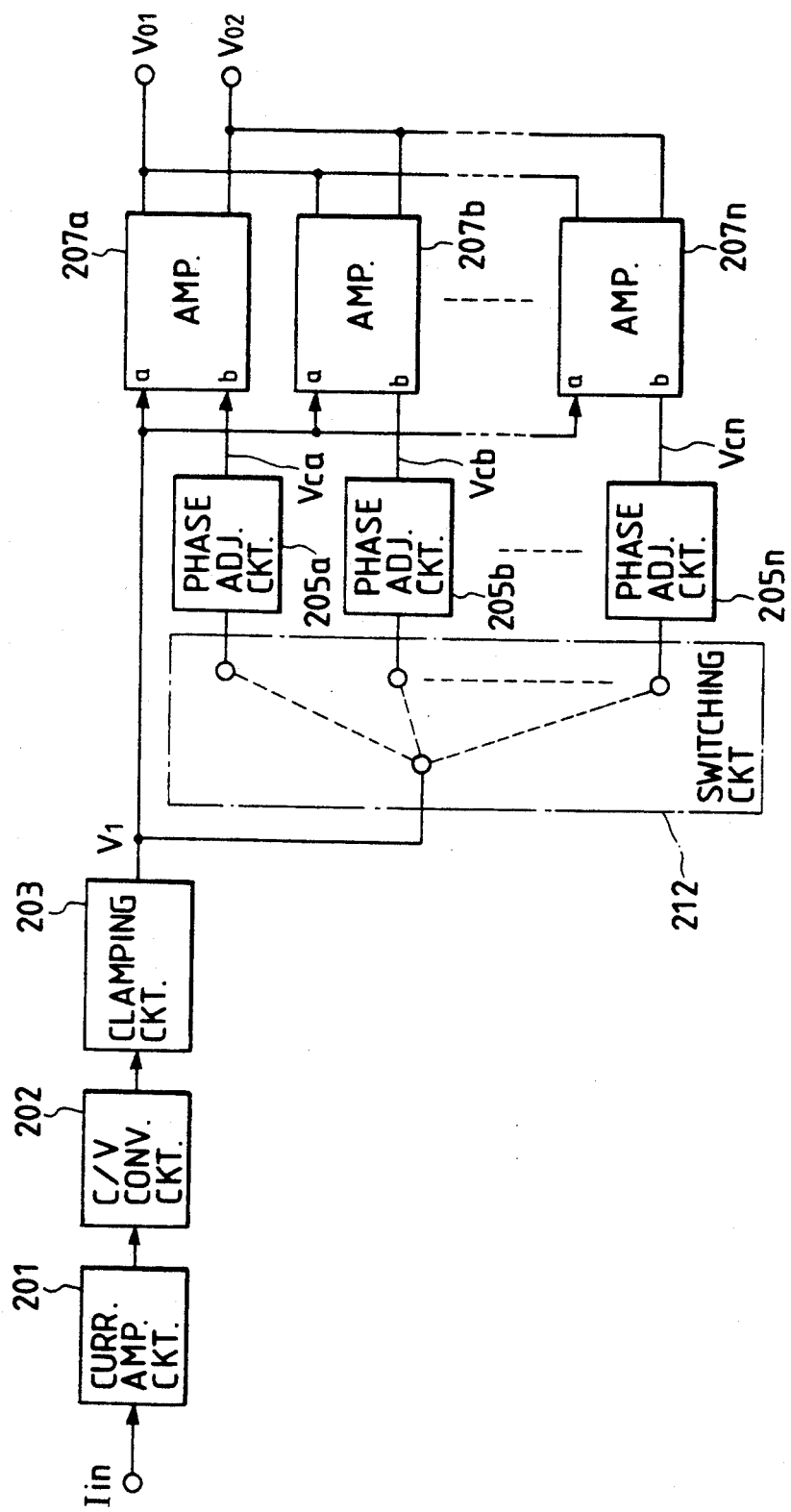

Moreover, as shown in FIG. 26, a switching circuit 212 for performing switching control of the transmission of the voltage signal $V_1$ is provided between the filtering circuit 204 and the plurality of phase adjusting circuits 205a and 205b. In this case, the voltage signals $V_{2a}$ and $V_{2b}$ are generated from the phase adjusting circuit to which the voltage signal $V_1$ is transmitted, and those voltage signals are fed separately to the plurality of amplifiers.

The embodiments described with reference to FIGS. 15-26 should be understood to be exemplary. The principles embodied therein may be applied effectively in an extensive range of modifications.

For example, the transistors $Q_1$ and $Q_{11}$ can be replaced with MOS transistors with high input impedance, further reducing power consumption in the preamplifier. Moreover, a voltage signal may be used in place of the input current $I_{in}$ is fed as the input signal. In such a case, the preamplifier can amplify the input voltage with a favorable signal-to-noise ratio even if the input signal is so weak and small an input voltage as to be on the order of approximately several mV.

Further, the number of the installed units of the amplifiers 207 is not limited to two or four such units; rather, any desired number of units may be employed, as illustrated by the dotted line amplifier 207n shown in each of the accompanying drawings.

Also, not only the transistors $Q_1$ and $Q_{11}$, which perform current amplification, but also the entire preamplifier may be constructed with MOS transistors, or may be constructed with such other elements as bipolar transistors, CMOS transistors, GaAs (gallium arsenide) elements, and Josephson devices.

In the examples given above, the capacitors forming the phase adjusting circuits are provided at the power source side, but instead they may be installed at the GND side.

Further, as with the other preceding embodiments, the preamplifier can be used in an extensive range of applications in all electronic appliances which are required to detect electric currents in excess of several $\mu$A and to convert such currents into voltage, such as preamplifiers for scanners, electric charge detecting circuits for CCD area sensors, and preamplifiers for optical communication receivers.

As just described, the preamplifier according to this aspect of the invention is constructed with a first signal processing system, which amplifies the input signal with the prescribed gain and also has a filtering function; a second signal processing system, which generates output signals as adjusted to the desired phase difference in relation to the output signals from the first signal processing system mentioned above; a plurality of amplifiers having different gains and also having a pair of input terminals to which the output signals from the first and second signal processing systems are fed; and one of a selecting device which selectively drives the plurality of amplifiers by control signals, or a transmission selecting device which selects the transmission of the output signals to the plurality of amplifiers.

With the preamplifier constructed as described with respect to FIGS. 15-26, it is possible to select any of the plurality of amplifiers in a way suitable for the current rate, voltage level, or the like of the input signal, and to obtain an output signal that is amplified with the desired gain. Moreover, the output signal from the second signal processing system can be adjusted to a desired phase difference in relation to the output signal from the first signal processing system in this preamplifier, so that it is possible to control the elimination of the gain, frequency characteristics, and noise components in the signals, together with the selection of the amplifiers mentioned above. With these features, the invention offers a preamplifier capable of achieving a very favorable signal-to-noise ratio.

Figure 27:
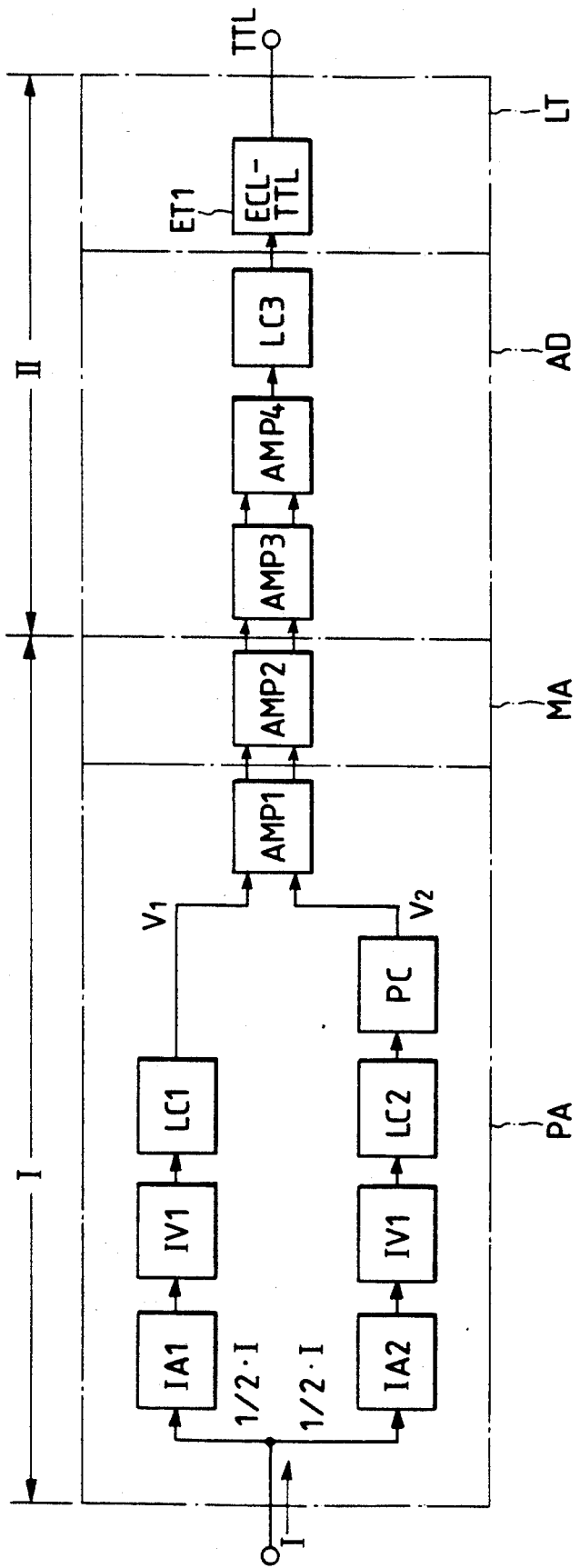
FIG. 27 is a block diagram showing the circuitry forming the overall construction of a waveform shaping circuit according to the invention, incorporating the preamplifier of one or more of the first through eleventh embodiments.

FIG. 27 shows an embodiment of a waveform shaping circuit according to the invention. Circuit block I illustrates an analog signal processing system, which is composed of a preamplifier PA and a main amplifier MA. Circuit block II shows a digital signal processing system, which is composed of an analog-digital converter AD and a level converter LT.

The preamplifier PA is composed of a pair of current amplifying circuits IA1 and IA2, in which the input impedance is kept substantially at the same level; a pair of current-voltage converters IV1 and IV2, which convert the output current into voltage; a pair of level clamping circuits LC1 and LC2, which clamp at the prescribed value the output voltage from the current-voltage converters IV1 and IV2 when the input current I exceeds a predetermined current value; and a phase adjusting circuit PC, which feeds the voltage signal $V_1$ and $V_2$ with a difference in phase to a differential amplifying circuit AMP1. The main amplifier MA, which is composed of a differential amplifying circuit AMP2, amplifies the output voltages, output in mutually opposite phases from the differential amplifying circuit AMP1, to the prescribed voltage level.

The analog-digital converter AD is composed of differential amplifying circuits AMP3 and AMP4, which amplify the output voltage from the differential amplifying circuit AMP2 to a higher voltage, stage by stage, and a level clamping circuit LC3. The level converter LT is composed of an ECL-TTL conversion circuit ET1 and converts the ECL voltage level to at least 3 V, for example.

Figure 28:
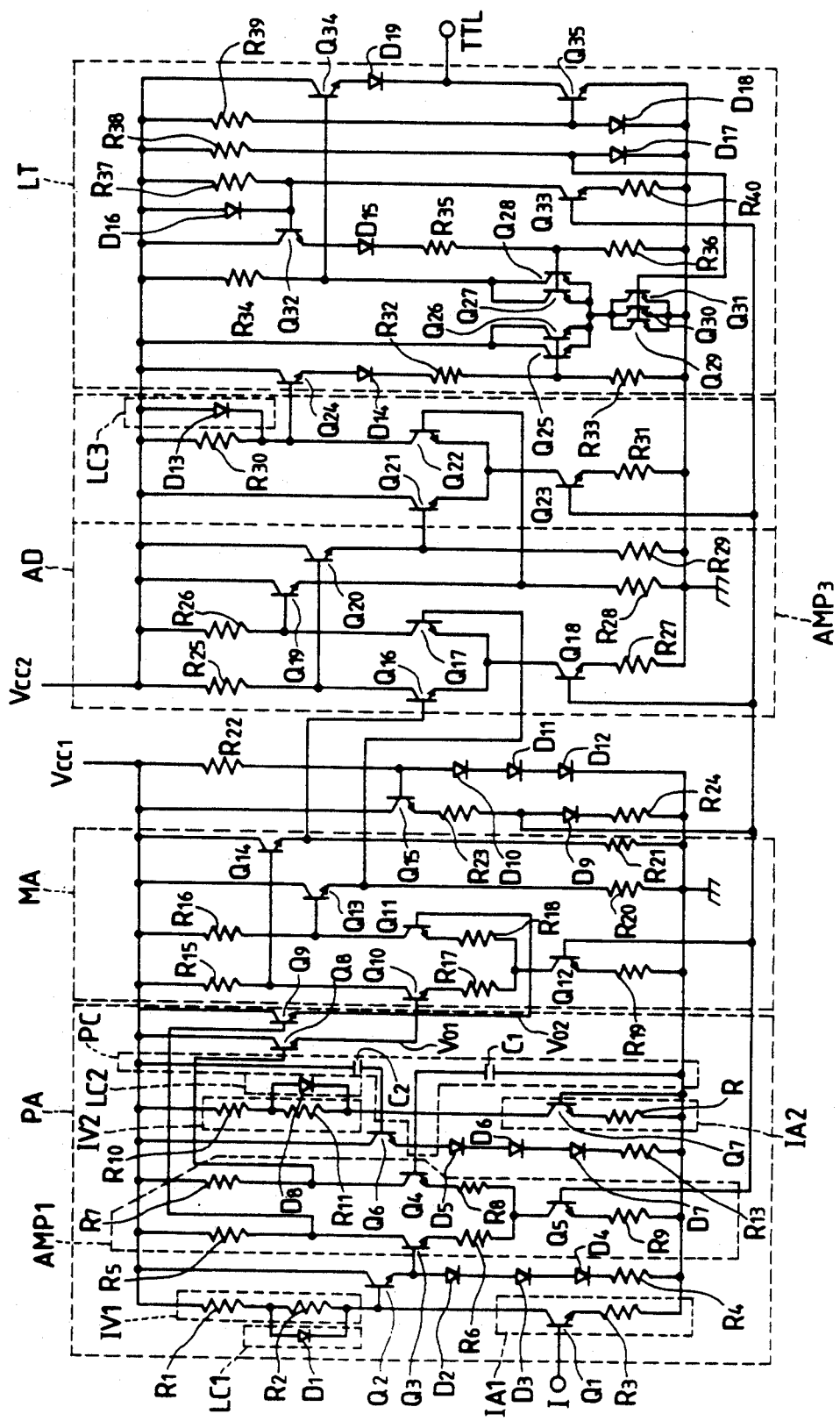
FIG. 28 is a circuit diagram showing a specific example of the circuit of FIG. 27.

FIG. 28 shows a specific implementation of the circuit of FIG. 27. The current amplifying circuit IA1 is composed of a transistor $Q_1$ and a resistor $R_3$, and the current amplifying circuit IA2 is composed of a transistor $Q_7$ and a resistor $R_{14}$. However, the resistors $R_3$ and $R_{14}$ may be eliminated.

The current-voltage conversion circuit IV1 is composed of resistors $R_1$ and $R_2$, which are connected in series between the collector of the transistor $Q_1$ and the power source $V_{ccl}$. The diode $D_1$, which forms the level clamping circuit LC1, clamps the maximum voltage drop in the resistor $R_2$ at the voltage in the forward direction $V_f$. The current-voltage conversion circuit IV2 is composed of the resistors $R_{10}$ and $R_{11}$ which are connected in series. The diode $D_2$, which forms the level clamping circuit LC2, clamps the maximum voltage drop in the resistor $R_{11}$ at the voltage in the forward direction $V_f$.

The transistors $Q_3$ through $Q_5$ and the resistors $R_5$ through $R_9$ form the differential amplifying circuit AMP1. The output voltages obtained in mutually opposite phases by the effect of the voltage drops in the load resistors $R_5$ and $R_7$ are fed to the main amplifier MA at the next stage via the output transistors $Q_8$ and $Q_9$. Moreover, the transistor $Q_2$, the diodes $D_2$ through $D_4$ which work as level shifter and the resistor $R_4$ set the bias voltage of the transistor $Q_3$, while the transistor $Q_6$, the diodes $D_5$ through $D_7$, and the resistor $R_{13}$ set the bias voltage for the transistor $Q_4$.

The phase adjusting circuit PC is composed of the capacitors $C_1$ and $C_2$ and delays the change in (i.e., phase adjusts) the level of the base voltage of the transistor $Q_4$, in response to a change in the level of the base voltage of the transistor $Q_1$ at the time of the feeding of the input voltage. The main amplifier MA is composed of the transistors $Q_{10}$ through $Q_{14}$ and the resistors $R_{15}$ through $R_{21}$; of these, the transistors $Q_{13}$ and $Q_{14}$ are output transistors. Moreover, the transistor $Q_{15}$, the diodes $D_9$ through $D_{12}$, and the resistors $R_{22}$ through $R_{24}$ comprise bias voltage setting circuit.

Next, the analog-digital conversion circuit AD will be described. The differential amplifying circuit AMP3 is comprised of the transistors $Q_{16}$ through $Q_{20}$ and the resistors $R_{25}$ through $R_{29}$, and the differential amplifying circuit AMP4 is comprised of the transistors $Q_{21}$ through $Q_{23}$ and the resistors $R_{30}$ and $R_{31}$. Diode $D_{13}$ forms the level clamping circuit LC3, which clamps the changes in the maximum level of the output voltage from the differential amplifying circuit AMP4 at the voltage in the forward direction $V_f$.

The ECL-TTL conversion circuit ET1 is composed of transistors $Q_{24}$ through $Q_{35}$, diodes $D_{14}$ through $D_{19}$, and resistors $R_{32}$ through $R_{38}$, of which the resistor $R_{38}$ and the diode $D_{17}$ work as a bias voltage setting circuit.

Figure 29A:
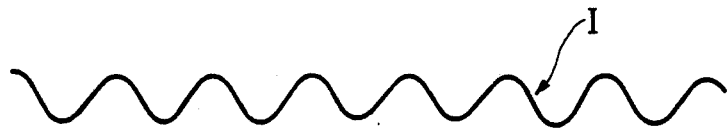
FIGS. 29A-29F are waveforms for explaining the operations of the circuit of FIGS. 27 and 28.
Figure 29B:

Next, the operation of the circuit will be described with reference to FIG. 29. The input current I shown in FIG. 29A is divided into two parts, each of which is fed to the current amplifying circuits IA1 and IA2, respectively. Then, the current multiplied by $h_{fe}$ (the emitter grounding current amplification factor) by the transistors $Q_1$ and $Q_7$ is converted into voltage by the current-voltage converting circuits IV1 and IV2. If the input current I becomes large in the course of this conversion, the voltage drop in the resistor $R_2$ will be so large that the transistor $Q_5$, which forms the current source, can become saturated, and thus have difficulty in its operation. However, the voltage drop is clamped by the level clamping circuit LC1, so that the transistor $Q_5$ performs normally without being saturated.

Figure 29C:
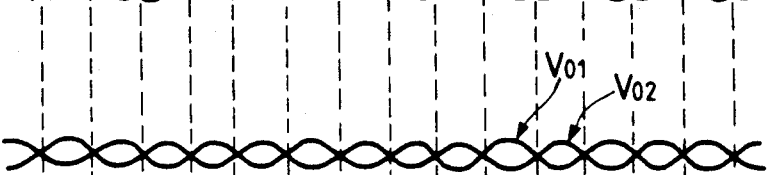

One-half of the input current fed into the current amplifying circuit IA2 is adjusted in phase by the phase adjusting circuit PC, and the input voltages $V_1$ and $V_2$, which have a phase difference in phase as shown in FIG. 29C are fed into the differential amplifying circuit AMP1. That is, the phase shift between the input voltages $V_1$ and $V_2$ forms a difference in electric potential between the input voltages to the differential amplifying circuit AMP1, and so the differential amplifying circuit AMP1 can perform its operation. Then, the differential amplifying circuit AMP1 generates the output voltages $V_{01}$ and $V_{02}$, which have mutually opposite phases corresponding to the phase difference mentioned above, and the output voltages are fed to the main amplifier in the subsequent stage.

In this regard, the electric potential of the input voltage $V_1$ and that of the input voltage $V_2$ will always be at the same level in the case of the DC current, and, even if there are any fluctuations in the power source and in temperature, both of the electric potentials of $V_1$ and $V_2$ will change in the same ratio. It follows from this that no change occurs in the level of $V_1$ and $V_2$ in correspondence to fluctuations in the electric power source and so forth, and fluctuations in temperature and power do not affect the output voltages $V_{01}$ and $V_{02}$ in AMP1.

Figure 29D:

The output voltages $V_{01}$ and $V_{02}$ are amplified to the prescribed levels by the main amplifier MA, as shown in FIG. 29D, and are fed to the differential amplifying circuit AMP3 in the subsequent stage.

The differential amplifying circuits AMP3 and AMP4 amplify the output voltages $V_{01}$ and $V_{02}$ and also convert the output voltage into digital signals by setting the amplification degree at a large ratio. Thus, with all of AMP1 through AMP4 constructed in the form of differential amplifying circuits, the levels of the signals in the two input change together in each amplifying stage when any fluctuations occur in temperature and power. Accordingly, so long as such changes occur in the level of the signals in the differential amplification, the level changes scarcely affect the output, so that stable amplification and digital conversion can be performed.

Figure 29E:
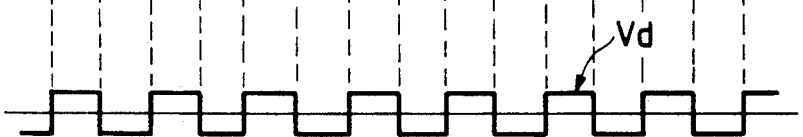
Figure 29F:
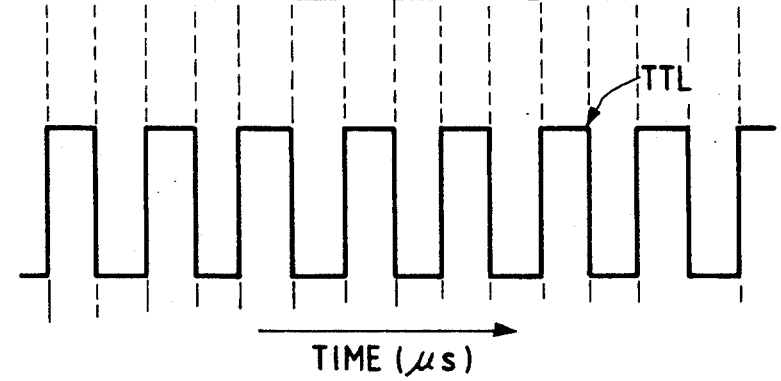

In this regard, it is to be noted that it is necessary for the main circuit always to output digital signals in a certain constant amplitude for the various signals with differences in the volume of input signals. To attain this purpose, the clamping circuit LC3 is provided to clamp the output level. The circuit is designed to obtain a digital signal $V_d$ with amplitude stability, as shown in FIG. 29E, with the diode $D_{13}$ clamping the digital signal obtained by the effect of a voltage drop in the resistor $R_{30}$ shown in FIG. 28. After the input signal thus is converted into the digital signal Vd at a constant amplitude, the digital signal is converted into a signal at the TTL level by the ECL-TTL conversion circuit ET1, and the TTL output thus is obtained.

The circuitry up to the front stage of this ECL-TTL conversion circuit ET1 is constructed so as to operate with high stability against fluctuations in power and temperature. Therefore, the same effect also is achieved in the ECL-TTL conversion circuit ET1, and, in addition, the notable contrivances below are incorporated into the present ECL-TTL conversion circuit ET1 in order to support its operation at a higher speed as compared with the existing TTL circuit.

Specifically, a reference voltage generating circuit (the transistor $Q_{33}$ and the resistor $R_{37}$) for the ECL-TTL conversion circuit ET1 is formed in exactly the same construction as that for the differential amplifying circuit AMP4 at the preceding stage to the exclusion of the transistors $Q_{21}$ and $Q_{22}$ from its current switch section. With this circuit construction, the circuit can change the reference voltage of the ET1 in the same ratio, even if there is a change in the input signal along with the fluctuations in power, and thus it is possible to set the reference voltage almost in the middle of the voltage amplitude of the input signal.

In addition, with the output signal being obtained from the load resistor $R_{34}$, which is connected to the collectors of the transistor $Q_{27}$ and the transistor $Q_{28}$ both connected on the side of the reference voltage, the transistors $Q_{27}$ and $Q_{28}$ will not be saturated even if the voltage amplitude in the load resistor $R_{34}$, which is the voltage amplitude of the output signal, becomes as high as approximately 3 V, and consequently the ECL-TTL conversion circuit ET1 can operate at a higher speed in comparison with the conventional TTL circuit.

Further, with this circuit construction, provided with a current switch having a reference voltage, the level of the output voltage in the ECL-TTL conversion circuit ET1 according to the invention can be set, not at the intermediate level as with the conventional TTL circuit, but either at a low level or at a high level when the input signal is not applied to the circuit. Also, even with the overlapping of noise on the input signals into the ET1, the inventive circuit is capable of putting the waveform into a proper shape to some extent, thus displaying also a noise eliminating function.

In the inventive circuit, the analog signal processing system and the digital signal processing system are incorporated into a single chip, and the two signal processing systems are provided with separate power source lines and separate grounding lines, as the result of a design effort to prevent noise generated in the digital signal processing system from being transmitted to the analog signal processing system by the power source line or the grounding line. Therefore, it is possible to reduce the influence of the noise on the circuit, even though both the analog signal processing system and the digital signal processing system are on the same chip.

Moreover, in this embodiment, it also is feasible to connect the base of the transistors $Q_1$ and $Q_7$ in the preamplifier to the internal voltage source by way of resistors, thus keeping the transistors $Q_1$ and $Q_7$ always turned ON, thereby converting the input current into TTL voltage signals at a high speed.

Figure 30:
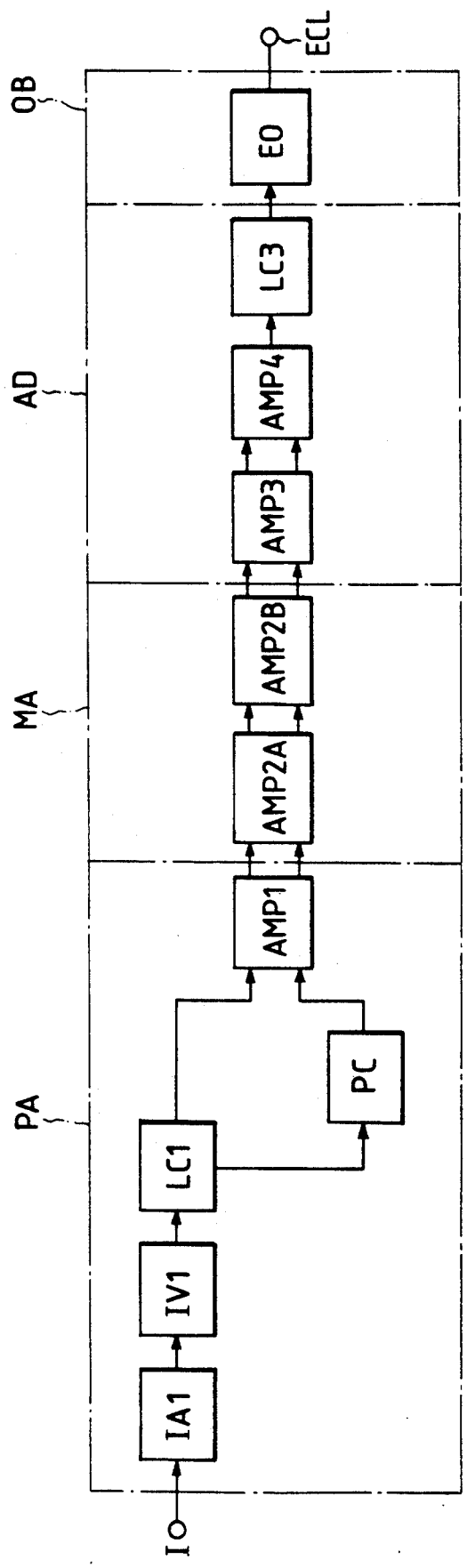
FIG. 30 is a block diagram showing another embodiment of the inventive waveform shaping circuit.

A second preferred embodiment of the inventive waveform shaping circuit is shown in FIG. 30. The difference between this embodiment and the FIG. 27 embodiment consists in constructing the circuitry of the preamplifier with one current amplifying circuit IA1, a phase adjusting circuit PC, and a differential amplifying circuit AMP1, and constructing the main amplifier MA with two differential amplifying circuits AMP2A and AMP2B. In this embodiment, digital signals at the ECL level are obtained from the analog input current, and the other operations and effects of the circuit in this construction are the same as those of the first example.

The inventive waveform shaping circuit advantageously may employ one or more of the preceding embodiments of the inventive preamplifier, such as those shown in FIGS. 12 and 13.

In FIG. 12, transistors $Q_{21}$ and $Q_{22}$, together with resistors $R_{31}$, constitute the current amplifying circuit IA1. Resistors $R_{33}$ and $R_{34}$ comprise the current-voltage conversion circuit IV1, and diode $D_{21}$ functions as the level clamping circuit LC1. Also, transistors $Q_3$, $Q_{13}$, $Q_{23}$, and $Q_{24}$, resistors $R_{21}$-$R_{24}$, and current sources CS, CS, and $CS_1$ comprise differential amplifier AMP1. Capacitors $C_1$ and $C_2$ comprise the phase adjusting circuit PC.

As described earlier, the preamplifier shown in FIG. 12 is constructed to feed the voltage $V_1$ obtained from the current-voltage conversion circuit IV1 to one of the input terminals of the differential amplifying circuit AMP1 while feeding the voltage to the other input terminal after a phase adjustment, instead of dividing the input current into two parts. This embodiment thus achieves a simplified circuit construction.

Further, the individual circuits just described work in the same way, and they generate the output signals $V_{01}$ and $V_{02}$ in mutually reverse phases for the input current I.

Another embodiment of a preamplifier suitable for use in the inventive waveform shaping circuit is shown in FIG. 13. This preamplifier is constructed with MOS transistors in place of bipolar transistors.

While the inventive waveform shaping circuit has been described with reference to some preferred embodiments, the invention is not limited to those embodiments, but also can be modified in a number of ways. For instance, while the embodiments of FIGS. 12 and 13 have been mentioned as suitable candidates for preamplifiers for the inventive waveform shaping circuit, any of the embodiments described above would be suitable. Further, the capacitor forming the phase adjusting circuit shown above has a fixed capacitance, so that the circuit may operate within a specified frequency range with respect to the input signal (i.e. electric current and electric charge). However, the capacitor may be positioned externally, so that its capacitance may be varied to permit the phase adjusting circuit to operate in a manner suitable to any given frequency.

Furthermore, the semiconductor elements of which the inventive waveform shaping circuit is composed are not limited to the bipolar transistors and the MOS transistors mentioned above, but may also be an integrated circuit with a mixed use of bipolar transistors and MOS transistors. Also, the circuit also may be constructed with such other elements as bipolar transistors, CMOS transistors, GaAs (gallium arsenide) elements, and Josephson devices.

Furthermore, the waveform shaping circuit can be used extensively for all electronic appliances that are required to detect and to convert any current on the order of several $\mu$A, for example, a preamplifier for a scanner, an electric charge detecting circuit for a CCD area sensor, and a preamplifier for an optical communication receiver. Above all, the inventive waveform shaping circuit is suitable for scanners for use in printing and for integrated circuits.

As described hereinabove, the inventive waveform shaping circuit includes a preamplifier constructed so as to convert the input current into voltage signals and to feed the converted signals to one of the input terminals of a differential amplifying circuit while adjusting the phase of the voltage signal and feeding the phase-adjusted voltage signals to the other of the input terminals of the differential amplifying circuit, so that the circuit may obtain two output signals amplified on the basis of the voltage difference between the input terminals, with an amplifying system comprised of differential amplifying circuits which amplify the two output signals. Further, the circuit includes an analog-digital conversion circuit provided with a level clamping circuit, which clamps the amplitude of the digital signals.

Therefore, the inventive waveform shaping circuit not only has a simple circuit construction, but also offers such features as elimination of noise and the clamping of the amplitude level of digital signals in the differential amplifying circuits. All these features work together to achieve stable operation in the circuit as well as a reduction of fluctuations of the digital signals.

While the invention has been described in detail above with reference to a preferred embodiment, various modifications within the scope and spirit of the invention will be apparent to people of working skill in this technological field. Thus, the invention should be considered as limited only by the scope of the appended claims.

What is claimed is:

1. A preamplifier comprising:
   a first current-voltage conversion circuit for converting an input current to a first voltage, and providing said first voltage accordingly;
   a second current-voltage conversion circuit for converting said input current to a second voltage, and providing a second voltage accordingly;
   a first phase adjusting circuit, responsive to said first voltage, for generating a first voltage signal having a first desired difference in phase in relation to said input signal;
   a second phase adjusting circuit, responsive to said second voltage, for generating a second voltage signal having a second desired difference in phase in relation to the first voltage signal, said second desired difference being different from said first desired difference; and
   a differential amplifier having a first input terminal receiving said first voltage signal and a second input terminal receiving said second voltage signal, said differential amplifier producing first and second output signals, having opposite phases, corresponding to a difference between said first and second voltage signals.

2. A preamplifier according to claim 1, further comprising:
   first voltage clamping means, connected to said first current-voltage conversion circuit, for clamping a level of said first voltage output by said first current-voltage conversion circuit when said input current exceeds a predetermined level; and
   second voltage clamping means, connected to said second current-voltage conversion circuit, for clamping a level of said second voltage output by said second current-voltage conversion circuit when said input current exceeds said predetermined level.

3. A preamplifier comprising:
   a current amplifying circuit for amplifying an input current;
   a current-voltage conversion circuit for converting said amplified current to a voltage;
   a voltage clamping circuit, connected to said current-voltage conversion circuit, for clamping said voltage output by said current-voltage conversion circuit when said input current exceeds a predetermined level;
   a first phase adjusting circuit, receiving an output of said voltage clamping circuit, for generating a first voltage signal having a first desired difference in phase in relation to said input signal;
   a second phase adjusting circuit, receiving an output of said first phase adjusting circuit, for generating a second voltage signal having a second desired difference in phase in relation to the first voltage signal, said second desired difference being different from said first desired difference; and
   a differential amplifier having a first input terminal receiving said first voltage signal and a second input terminal receiving said second voltage signal, said differential amplifier producing output signals corresponding to a difference between said first and second voltage signals.

4. A preamplifier comprising:
   a signal conversion circuit for converting an input current into a voltage signal, said signal conversion circuit comprising means for reducing a change in level of said voltage signal when said input current exceeds a predetermined value;
   a phase adjusting circuit for adjusting a phase of said voltage signal and producing a phase-adjusted voltage signal; and
   a differential amplifier, having a first input terminal receiving said voltage signal and a second input terminal receiving said phase-adjusted voltage signal, for producing first and second output signals corresponding to a difference in voltage between said voltage signal and said phase-adjusted voltage signal.

5. A preamplifier according to claim 4, further comprising means for dividing said input current into first and second divided currents, wherein said signal conversion circuit comprises first and second conversion means, each receiving a respective one of said first and second divided currents and converting said respective one of said first and second divided currents into respective first and second voltage signals; and wherein said phase adjusting circuit adjusts a phase of one of said first and second voltage signals.

6. A preamplifier according to claim 4, wherein said signal conversion circuit comprises:
current amplification means for amplifying said input current; and
a pair of series-connected resistors, connected to said current amplification means, for converting said input current into said voltage signal; and
wherein said means for reducing a change of level of said voltage signal comprises a diode connected between one end of said series-connected resistors and a junction between said first and second series-connected resistors.

7. A preamplifier according to claim 5, wherein each of said first and second conversion means comprises:
current amplification means for amplifying a respective one of said first and second divided currents;
voltage conversion means for converting a respective one of said amplified first and second divided currents to a voltage;
voltage clamping means, connected to said voltage conversion means, for clamping a level of a respective one of said first and second voltage signals when said input current exceeds said predetermined value; and
level shifting means, responsive to a respective one of said first and second voltage signals, for applying a bias to a respective one of said first and second voltage signals.

8. A preamplifier according to claim 5, wherein each of said first and second conversion means comprises respective first and second pluralities of MOS transistors, connected in a source follower configuration;
said differential amplifier comprises another plurality of MOS transistors; and
wherein said preamplifier further comprises an additional MOS transistor, receiving a reset signal at a gate thereof, for switching said preamplifier between set and reset states.

9. A preamplifier according to claim 4, further comprising an internal voltage source, connected to said phase adjusting circuit, for decreasing a response time of said preamplifier.

10. A preamplifier comprising:
a first signal processing system for amplifying an input signal to a desired level and producing an amplified output signal;
a second signal processing system for producing an output signal having a desired phase difference in relation to the amplified output signal from said first signal processing system;
a plurality of amplifiers, having different gains, for generating an output signal in correspondence to a voltage difference between the amplified output signal from said first signal processing system and the output signal from said second signal processing system; and
one of transmission selecting means for selectively transmitting one of the amplified output signal from said first signal processing system and the output signal from said second signal processing system to said plurality of amplifiers; and amplifier selecting means for selectively driving at least a desired one of said plurality of amplifiers.

11. A preamplifier according to claim 10, wherein said transmission selecting means comprises a switching circuit for selecting one of the amplified output signal from the first signal processing system and the output signal from the second signal processing system to obtain a selected output signal, and for transmitting the selected output signal to a selected one of said plurality of amplifiers.

12. A preamplifier according to claim 10, wherein said amplifier selecting means comprises a control circuit having at least one control signal input, for selectively feeding and cutting off power to said plurality of amplifiers.

13. A preamplifier according to claim 10, wherein said transmission selecting means comprises a switching circuit receiving both of said amplified output signal and said output signal from said second signal processing system, and transmitting said amplified output signal and said output signal to a selected one of said plurality of amplifiers.

14. A preamplifier according to claim 12, wherein said plurality of amplifiers comprises two amplifiers, and wherein said control circuit has one control signal input for selectively feeding and cutting off power to said two amplifiers.

15. A preamplifier according to claim 12, wherein said plurality of amplifiers comprises four amplifiers, and wherein said control circuit has two control signal inputs for selectively feeding and cutting off power to said four amplifiers.

16. A preamplifier comprising:
a first signal processing system for amplifying an input signal to a desired level and producing an amplified output signal:
transmission means, having at least one input and a plurality of outputs, said transmission means receiving said amplified output signal and providing said amplified output signal selectively to one of said outputs:
a plurality of phase adjusting means, each connected to a respective one of said plurality of outputs of said transmission means, for adjusting a phase of said amplified output signal and producing a phase-adjusted amplified output signal; and
a plurality of amplifiers, each receiving said amplified output signal, and also receiving said phase-adjusted amplified output signal from a respective one of said plurality of phase-adjusting means, each of said plurality of amplifiers having a different gain, and each of said plurality of amplifiers having two outputs for producing respective output signals having opposite phases.

17. A waveform shaping circuit, comprising:
an analog signal processing system for obtaining a voltage output corresponding to an input current, said analog signal processing system including a preamplifying circuit; and
a digital signal processing system, provided in series with said analog signal processing system, for obtaining a digital signal based on said voltage output, said digital signal processing circuit including an analog-digital conversion circuit:
wherein said preamplifying circuit comprises a phase adjusting circuit for adjusting a phase of said voltage output, such that said preamplifying circuit outputs a first voltage signal and a second voltage signal that is phase-adjusted with respect to said first voltage signal;

said preamplifying circuit further comprising a differential amplifying circuit having first and second terminals receiving said first and second voltage signals, respectively; and wherein said analog-digital conversion circuit comprises a level clamping circuit for clamping an amplitude of the digital signal output from said analog-digital conversion circuit when said input current exceeds a predetermined level.

18. A waveform shaping circuit according to claim 17, wherein said waveform shaping circuit further comprises a fluctuating amplifying circuit, having two inputs and two outputs, for amplifying an output of said differential amplifying circuit, and for compensating for fluctuations in temperature and in said input current.

19. A waveform shaping circuit according to claim 17, wherein said digital signal processing system further comprises a level conversion circuit, having an input and an output, for converting said voltage output from an ECL level to a TTL level, said level conversion circuit including a reference voltage generating circuit provided at said input of said level conversion circuit, said waveform shaping circuit further comprising a first current source acting as a first reference voltage source, a front stage of said level conversion circuit having a second current source, an input driving section of said level conversion circuit having a second reference voltage source, said first current source being identical to said second current source, said first reference voltage source being identical to said second reference voltage source.

20. A waveform shaping circuit comprising:

an analog signal processing system for obtaining a voltage output corresponding to an input current, said analog signal processing system including a preamplifying circuit; and a digital signal processing system, provided in series with said analog signal processing system, for obtaining a digital signal based on said voltage output, said digital signal processing circuit including an analog-digital conversion circuit;

wherein said preamplifying circuit comprises:

a first phase adjusting circuit, responsive to said input current, for generating a first voltage signal having a first desired difference in phase in relation to said input current;

a second phase adjusting circuit, responsive to said input current, for generating a second voltage signal having a second desired difference in phase in relation to the first voltage signal said first desired difference being different from said first desired difference; and a differential amplifier having a first input terminal receiving said first voltage signal and a second input terminal receiving said second voltage signal, said differential amplifier producing output signals corresponding to a difference between said first and second voltage signals; and wherein said analog-digital conversion circuit comprises a level clamping circuit for clamping an amplitude of the digital signal output from said analog-digital conversion circuit when said input current exceeds a predetermined level.

21. A waveform shaping circuit according to claim 20, wherein said preamplifying circuit further comprises:

a current amplifying circuit for amplifying said input current;

a current-voltage conversion circuit for converting said amplified input current to a voltage;

a voltage clamping circuit, connected to said current-voltage conversion circuit, for clamping said voltage output by said current-voltage conversion circuit when said input current exceeds a predetermined level;

wherein said first phase adjusting circuit receives an output of said voltage clamping means, said second phase adjusting circuit being responsive to an output of said first phase adjusting circuit, said first and second voltage signals being provided to said differential amplifier accordingly.

22. A waveform shaping circuit comprising, an analog signal processing system for obtaining a voltage output corresponding to an input current, said analog signal processing system including a preamplifying circuit; and a digital signal processing system, provided in series with said analog signal processing system, for obtaining a digital signal based on said voltage output, said digital signal processing circuit including an analog-digital conversion circuit;

wherein said preamplifying circuit comprises:

a signal conversion circuit for converting said input current into a voltage signal;

a phase adjusting circuit for adjusting a phase of said voltage signal and producing a phase-adjusted voltage signal; and a differential amplifier, having a first input terminal receiving said voltage signal and a second input terminal receiving said phase-adjusted voltage signal, for producing output signals corresponding to a difference in voltage between said voltage signal and said phase-adjusted voltage signal; and wherein said analog-digital conversion circuit comprises a level clamping circuit for clamping an amplitude of the digital signal output from said analog-digital conversion circuit when said input current exceeds a predetermined level.

23. A waveform shaping circuit according to claim 22, wherein said signal conversion circuit comprises means for reducing a change of level of said voltage signal when said input current exceeds a predetermined value.

24. A waveform shaping circuit according to claim 22, further comprising means for dividing said input current into first and second divided currents, wherein said signal conversion circuit comprises first and second conversion means, each receiving a respective one of said first and second divided currents and converting said respective one of said first and second divided currents into respective first and second voltage signals; and wherein said phase adjusting circuit adjusts a phase of one of said first and second voltage signals.

25. A waveform shaping circuit according to claim 23, wherein said signal conversion circuit further comprises:

current amplification means for amplifying said input current: and a pair of series-connected resistors, connected to said current amplification means, for converting said input current into said voltage signal; and wherein said means for reducing a change of level of said voltage signal comprises a diode connected between one end of said series-connected resistors and a junction between said first and second series-connected resistors.

26. A waveform shaping circuit according to claim 24, wherein each of said first and second conversion means comprises:
  current amplification means for amplifying a respective one of said first and second divided currents;
  voltage conversion means for converting a respective one of said amplified first and second divided currents to a voltage;
  voltage clamping means connected to said voltage conversion means, for clamping a level of a respective one of said first and second voltage signals when said input current exceeds said predetermined value; and
  level shifting means, responsive to a respective one of said first and second voltage signals, for applying a bias to a respective one of said first and second voltage signals.

27. A waveform shaping circuit according to claim 24, wherein each of said first and second conversion means comprises respective first and second pluralities of MOS transistors, connected in a source follower configuration;
  said differential amplifier comprises another plurality of MOS transistors; and
  wherein said preamplifier further comprises an additional MOS transistor, receiving a reset signal at a gate thereof, for switching said preamplifier between set and reset states.

28. A waveform shaping circuit comprising:
  an analog signal processing system for obtaining a voltage output corresponding to an input current, said analog signal processing system including a preamplifying circuit; and
  a digital signal processing system provided in series with said analog signal processing system, for obtaining a digital signal based on said voltage output, said digital signal processing circuit including an analog-digital conversion circuit;
  wherein said analog-digital conversion circuit comprises a level clamping circuit for clamping an amplitude of the digital signal output from said analog-digital conversion circuit when said input current exceeds a predetermined level;
  wherein said preamplifying circuit comprises:
  a first signal processing system for amplifying said input current to a desired level and producing an amplified output signal;
  a second signal processing system for producing an output signal having a desired phase difference in relation to the amplified output signal from said first signal processing system;
  a plurality of amplifiers, having different gains, for generating an output signal in correspondence to a voltage difference between the amplified output signal from said first signal processing system and the output signal from said second signal processing system; and
  one of transmission selecting means for selectively transmitting one of the amplified output signal from said first signal processing system and the output signal from said second signal processing system to said plurality of amplifiers; and amplifier selecting means for selectively driving at least a desired one of said plurality of amplifiers.

* * * * *